US012721116B2

(12) United States Patent
Chun et al.

(10) Patent No.: US 12,721,116 B2
(45) Date of Patent: Aug. 25, 2026

(54) SUBSTRATE PROCESSING METHOD

(71) Applicant: ASM IP Holding B.V., Almere (NL)

(72) Inventors: Seungju Chun, Gyeonggi-do (KR); ChangWan Lee, Daejeon (KR)

(73) Assignee: ASM IP Holding B.V., Almere (NL)

( * ) Notice: Subject to any disclaimer, the term of this patent is extended or adjusted under 35 U.S.C. 154(b) by 555 days.

(21) Appl. No.: 18/122,364

(22) Filed: Mar. 16, 2023

(65) Prior Publication Data

US 2023/0298930 A1 Sep. 21, 2023

Related U.S. Application Data

(60) Provisional application No. 63/322,032, filed on Mar. 21, 2022.

(51) Int. Cl.

| | |
|---|---|
| ***H01L 21/762*** | (2006.01) |
| ***C23C 16/455*** | (2006.01) |
| ***H01J 37/32*** | (2006.01) |
| ***H10P 14/60*** | (2026.01) |
| ***H10W 10/00*** | (2026.01) |
| ***H10W 10/17*** | (2026.01) |

(52) U.S. Cl.

CPC ....... *H10W 10/014* (2026.01); *C23C 16/4554* (2013.01); *H01J 37/32449* (2013.01); *H10P 14/6336* (2026.01); *H10P 14/6339* (2026.01); *H10W 10/17* (2026.01); *H01J 37/32082* (2013.01); *H01J 37/32834* (2013.01); *H01J 2237/332* (2013.01)

(58) Field of Classification Search

None

See application file for complete search history.

(56) References Cited

U.S. PATENT DOCUMENTS 10,727,046 B2 7/2020 Abel
2005/0282350 A1* 12/2005 Chou ................ H01L 21/76837 438/786
2018/0005801 A1 1/2018 Singhal
2020/0017967 A1* 1/2020 Abel .................. H01L 21/0228

* cited by examiner

*Primary Examiner* — Asok K Sarkar

(74) *Attorney, Agent, or Firm* — Snell & Wilmer L.L.P.

(57) ABSTRACT

Disclosed is a method of processing a substrate, including: providing the substrate into a reaction space, the substrate comprising a gap having a predetermined cross-sectional area and a depth, performing a first sub-cycle step for depositing a gap-filling material by a predetermined thickness along a surface of the gap by an atomic layer deposition method, performing a second sub-cycle step for forming a deposition inhibiting region in an upper region of the gap using a deposition inhibitor and repeating a super-cycle such that a cross-sectional area of an inlet region of the gap remains greater than that of a lower region thereof located below the inlet region, the super-cycle comprising at least one the first sub-cycle and at least one the second sub-cycle, wherein the gap is filled without an occurrence of a void in the gap. Further, a substrate processing method for controlling a position of the void in the gap using the disclosed method above is disclosed.

15 Claims, 18 Drawing Sheets

| | W/O | A | B | C |
|---|---|---|---|---|
| NF3 flow rate | 0 sccm | a sccm | b sccm | b sccm |
| NF3 HRF Power | 0W | m W | m W | n W |

N2 inhibitor
D
Wm
Wt
40
41
42
44

SUBSTRATE PROCESSING METHOD

CROSS-REFERENCE TO RELATED APPLICATIONS

This application claims priority to U.S. Provisional Patent Application Ser. No. 63/322,032 filed Mar. 21, 2022 titled SUBSTRATE PROCESSING METHOD, the disclosure of which is hereby incorporated by reference in its entirety.

BACKGROUND

1. Field

The present disclosure relates to a method of processing substrate including a recess region therein, and more particularly to a method of filling a gap structure of the substrate.

2. Description of the Related Art

A gap-fill process is widely used in a semiconductor manufacturing process and referred to a filling process for filling an insulating material or a conductive material in a gap structure, such as a shallow trench isolation (STI). On the other hand, as the integration of a semiconductor device increases, the aspect ratio (NR) of the gap structure is also increasing, and therefore, the difficulty of the technique for filling the gap structure without a seam or a void is also increasing.

A chemical vapor deposition (CVD) method or a plasma chemical vapor deposition (PECVD) method is generally used as a deposition technique in the semiconductor manufacturing process, and in such methods, a source gas and a reaction gas are supplied simultaneously into a reaction space to deposit a desired film on a substrate, and therefore, there is an advantage that the film-forming rate is high. However, in a case of applying the chemical vapor deposition method to the gap-fill process, since the film-forming rate in an upper region of the gap structure is relatively greater than the film-forming rate in a lower region thereof, there is a disadvantage that an inlet portion of the gap structure is closed first.

Therefore, the gap-fill process may be performed using an atomic layer deposition method, in which a film having a relatively uniform thickness along bottom and sidewall surfaces of a gap of the gap structure may be formed. On the other hand, in the prior art, when the aspect ratio of the gap structure is low or the gap structure is relatively simple, a layer-by-layer method, for example, the atomic layer deposition method may be used to fill the gap while conformally forming a film along the surface of the gap. However, as the aspect ratio of the gap structure increases along with the increase in the degree of integration of a semiconductor integrated circuit, it becomes increasingly difficult to fill the gap without voids in the gap through the conventional atomic layer deposition method.

FIG. 1 is a diagram conceptually showing a process in which a void is formed in a gap in a conventional general gap-fill process. Referring to FIG. 1A, a gap structure in which a gap 11 is formed in a substrate 10 is shown. A gap-fill layer 12 is formed on the substrate 10 on which the gap 11 is formed by performing a gap-fill process using an atomic layer deposition method. The gap-fill layer 12 is conformally formed on the exposed surface of the gap structure, that is, along a bottom surface and a sidewall surface of the gap, but the gap-fill layer 12 is formed to be relatively thicker in an inlet region of the gap 11, that is in an upper region than in a lower region of the gap 11.

Referring to FIG. 1B, as the gap-fill process further proceeds, the thickness of the gap-fill layer 12 in the upper region of the gap 11 gradually becomes thicker, and eventually the gap-fill layer 12 meets each other in the upper region of the gap 11 to form a void 14 in the gap 11 while first closing the upper region of the gap.

As such, the reason that the thickness of the gap-fill layer 12 becomes thicker in the upper region than in the lower region of the gap 11, is that as the aspect ratio of the gap increases and the switching period for a source gas, a reaction gas, and a purge gas, etc. is shortened in the atomic layer deposition method, the above gases do not reach sufficiently to the lower region of the gap due to the limitation of the distance that the gases move into the gap, and therefore, while the film formation does not sufficiently occur in the lower region of the gap, the gases are smoothly supplied in the upper region of the gap, so that the film formation occurs sufficiently in the upper region thereof.

SUMMARY

The present disclosure provides a substrate processing method in which a gap may be filled without the occurrence of a void in the gap in a gap-fill process.

The present disclosure provides a substrate processing method in which a gap may be filled while forming a void in a desired position in the gap in a gap-fill process.

Additional aspects will be set forth in part in the description which follows and, in part, will be apparent from the description, or may be learned by practice of the presented embodiments of the disclosure.

According to an aspect of the present disclosure, there is provided a method of processing a substrate, the method including: providing the substrate into a reaction space, the substrate including a gap having a predetermined cross-sectional area and a depth; performing a first sub-cycle step for depositing a gap-filling material by a predetermined thickness along a surface of the gap by an atomic layer deposition method; performing a second sub-cycle step for forming a deposition inhibiting region in an upper region of the gap using a deposition inhibitor; and repeating a super-cycle such that a cross-sectional area of an inlet region of the gap remains greater than a cross-sectional area of a lower region thereof located below the inlet region, the super-cycle comprising at least one the first sub-cycle and at least one the second sub-cycle, wherein the gap is filled without an occurrence of a void in the gap.

In some embodiments, in the step of repeating the super-cycle, a repetition ratio of the number of the first sub-cycle to the number of the second sub-cycle may be adjusted to control a depth of a deposition inhibiting end point of the deposition inhibiting region. In some embodiments, the repetition ratio of the number of the first sub-cycle to the number of the second sub-cycle may be in a range of about 15 to about 40.

In some embodiments, the step of repeating the super-cycle may be performed while constantly maintaining the repetition ratio of the number of the first sub-cycle to the number of the second sub-cycle. In some embodiments, the step of repeating the super-cycle may be performed while gradually increasing or decreasing the repetition ratio of the number of the first sub-cycle to the number of the second sub-cycle.

In some embodiments, in the step of repeating the super-cycle, a flow rate of the deposition inhibitor in the second sub-cycle may be adjusted to control a depth of a deposition inhibiting end point of the deposition inhibiting region. In some embodiments, the flow rate of the deposition inhibitor may be controlled by adjusting the fraction of the deposition inhibitor to a purge gas supplied with the deposition inhibitor for controlling the depth of the deposition inhibiting end point.

In some embodiments, the method may further include repeating only the first sub-cycle step, after the step of repeating the super-cycle is completed. In some embodiments, the method may further include a step of planarizing a surface of the gap after fully filling the gap.

In some embodiments, within one of the super-cycles, the second sub-cycle step may not be performed continuously.

In some embodiments, the super-cycle may further include performing a gas exchange step in at least one of between the first sub-cycle and the second sub-cycle and between the second sub-cycle and the first sub-cycle. In some embodiments, the gas exchange step may include a vacuum purge step and at least one of a reaction gas pre-flow step and a deposition inhibitor pre-flow step.

In some embodiments, the deposition inhibitor may include at least one of a nitrogen-containing gas or a fluorine-containing gas, and the fluorine-containing gas may include at least one of $NF_3$, $F_2$, $CF_4$, $BrF_3$, $SF_6$ and $ClF_3$, or mixtures thereof.

In some embodiments, in the second sub-cycle, a high frequency power and a low frequency power may be supplied at the same time to activate the deposition inhibitor.

According to an aspect of the present disclosure, there is provided a method of processing a substrate, the method including: providing the substrate into a reaction space, the substrate including a gap having a predetermined cross-sectional area and a depth; performing a first sub-cycle step for depositing a gap-filling material by a predetermined thickness along a surface of the gap by an atomic layer deposition method; performing a second sub-cycle step for forming a deposition inhibiting region in an upper region of the gap using a deposition inhibitor; and repeating a super-cycle such that an upper end of a void is positioned at a desired depth from an inlet region of the gap, the super-cycle comprising at least one the first sub-cycle and at least one the second sub-cycle; and planarizing a surface of the gap such that the void is buried within the gap.

In some embodiments, in the step of repeating the super-cycle, a repetition ratio of the number of the first sub-cycle to the number of the second sub-cycle may be adjusted to control a depth of a deposition inhibiting end point of the deposition inhibiting region.

In some embodiments, the repetition ratio of the number of the first sub-cycle to the number of the second sub-cycle may be maintained constant during the super-cycle. In some embodiments, the repetition ratio of the number of the first sub-cycle to the number of the second sub-cycle may gradually increase or gradually decrease during the super-cycle.

In some embodiments, in the step of repeating the super-cycle, a flow rate of the deposition inhibitor in the second sub-cycle may be adjusted to control a depth of a deposition inhibiting end point of the deposition inhibiting region. In some embodiments, the flow rate of the deposition inhibitor may be controlled by adjusting the fraction of the deposition inhibitor to a purge gas supplied with the deposition inhibitor for controlling the depth of the deposition inhibiting end point.

In some embodiments, the super-cycle may further include performing a gas exchange step in at least one of between the first sub-cycle and the second sub-cycle and between the second sub-cycle and the first sub-cycle.

In some embodiments, the deposition inhibitor may include a nitrogen-containing gas, or a fluorine-containing gas including at least one of $NF_3$, $F_2$, $CF_4$, $BrF_3$, $SF_6$, and $ClF_3$, or mixtures thereof.

In some embodiments, the gap may be a non-vertical gap in which a width of the gap in a middle region of the gap is greater than the width thereof in an upper region of the gap.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 12A shows process conditions and FIG. 12B shows a FT-IR comparison diagram according to the process conditions of FIG. 12A;

DETAILED DESCRIPTION

Figure 1A:
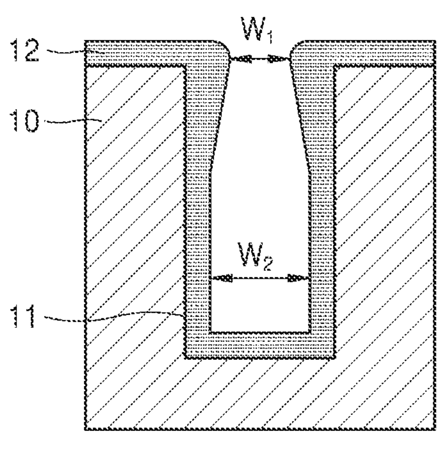
FIGS. 1A and 1B are cross-sectional views conceptually showing a process in which a void is formed in a gap structure.
Figure 1B:
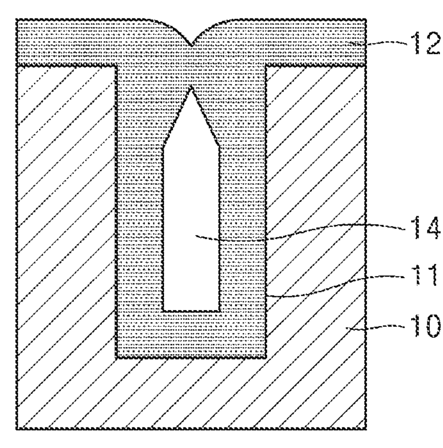

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the present disclosure will be described in detail with reference to the accompanying drawings.

Embodiments of the present disclosure are provided to further explain the present disclosure to one of ordinary skill in the art, and the following embodiments may have different forms and the scope of the present disclosure should not be construed as being limited to the descriptions set forth herein. Rather, these embodiments are provided so that the disclosure will be thorough and complete, and will fully convey the scope of the disclosure to one of ordinary skill in the art.

The terminology used herein is for describing particular embodiments and is not intended to limit the disclosure. As used herein, the singular forms "a", "an", and "the" are intended to include the plural forms as well, unless the context clearly indicates otherwise. It will be further understood that the terms "includes", "comprises" and/or "including", "comprising" used herein specify the presence of stated features, integers, steps, processes, members, components, and/or groups thereof, but do not preclude the presence or addition of one or more other features, integers, steps, processes, members, components, and/or groups thereof. As used herein, the term "and/or" includes any and all combinations of one or more of the associated listed items.

It will be understood that, although the terms first, second, etc. may be used herein to describe various members, components, regions, layers, and/or sections, these members, components, regions, layers, and/or sections should not be limited by these terms. These terms do not denote any particular order, upper and lower, or importance, but rather are only used to distinguish one member, region, layer, and/or section from another member, region, layer, and/or section. Thus, a first member, component, region, layer, or section discussed below could be termed a second member, component, region, layer, or section without departing from the teachings of embodiments.

Embodiments of the disclosure will be described hereinafter with reference to the drawings in which embodiments of the disclosure are schematically illustrated. In the drawings, variations from the illustrated shapes may be expected because of, for example, manufacturing techniques and/or tolerances. Thus, the embodiments of the disclosure should not be construed as being limited to the particular shapes of regions illustrated herein but may include deviations in shapes that result, for example, from manufacturing processes.

First, a description will be given of a gap-fill process for filling a gap without generating a void inside the gap by controlling the shape of a deposited film formed on a sidewall of the gap in a gap structure according to embodiments of the present disclosure.

FIGS. 2A to 2E are cross-sectional views illustrating the gap-fill process according to a process sequence, according to example embodiments of the present disclosure.

Figures 2A, 2B, 2C, 2D, 2E:
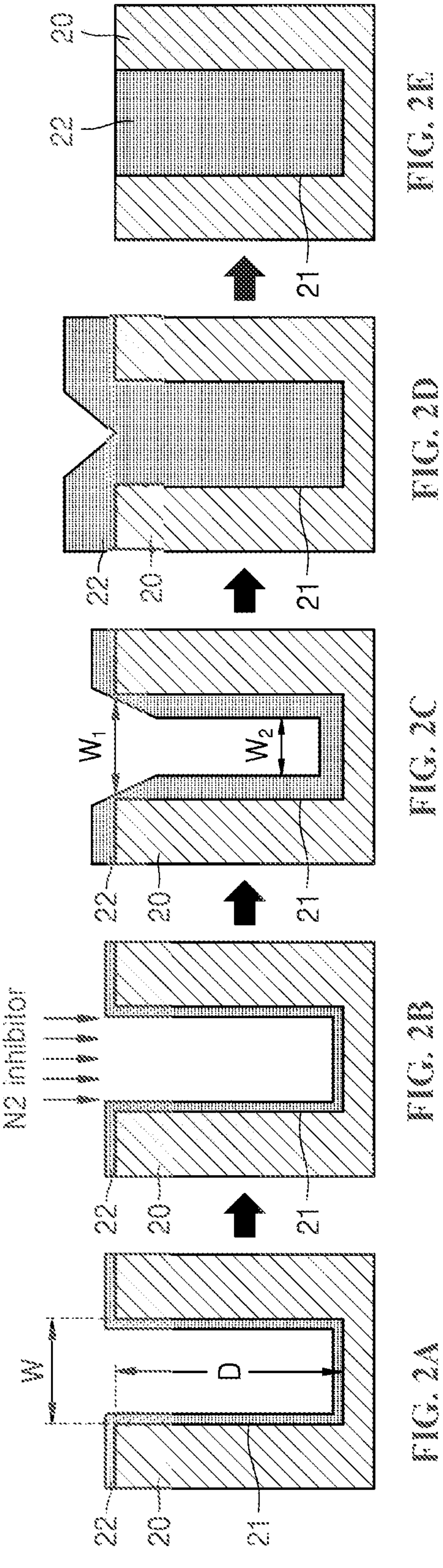
FIGS. 2A-2E are cross-sectional views showing a gap-fill process according to example embodiments of the present disclosure.

Referring to FIG. 2A, a gap structure including a gap 21 in a portion of a surface of a substrate 20 is shown, the gap 21 having a depth D in a vertical direction and a width W in a horizontal direction. The substrate may include semiconductor materials such as Si or Ge, or various compound semiconductor materials such as SiGe, SiC, GaAs, InAs, and InP, and may include various substrates to be used in a display device or a semiconductor device, etc., such as silicon on insulator (SOI), silicon on sapphire (SOS).

The gap 21 may be a shallow trench isolation (STI) generally used to define an active region of a semiconductor device in a semiconductor manufacturing process, and may be various types of recess regions formed on the surface of the substrate 20. In addition, the gap 21 may also be in the form of a via that penetrates a conductive layer between an insulating layer and another insulating layer, or penetrates an insulating layer between a conductive layer and another conductive layer.

FIG. 2A shows a vertical cross-sectional view including the gap 21, and the width W and the depth D are representatively used to indicate the size of the gap 21 under the assumption that the gap 21 has a cylindrical shape. However, the cross-sectional shape of the surface of the gap 21 may have various polygonal shapes such as an elliptical, triangular, rectangular, and pentagon, as well as a circular shape. The gap 21 may also have a shape in the form of an island with various surface cross-sectional shapes. Further, the gap 21 may also have a shape in the form of a line on the substrate 20. Hereinafter, unless otherwise specified, the size of the cross-sectional area of the surface extending in the horizontal direction of the gap 21 will be described based on the width thereof, for convenience of explanation.

On the other hand, the gap 21 may have a vertical profile having substantially equal width W from an inlet region of the gap 21 to a lower region thereof as shown in FIG. 2, but the gap 21 may have a non-vertical profile in which the width W increases or decreases from the inlet region of the gap 21 to the lower region thereof. In addition, the gap 21 may be the non-vertical profile in which the width W increases and then decreases, or the width W decreases and then increases. In addition, the gap 21 may have a three-dimensional internal structure including a plurality of protrusions in the gap 21, for example, in a stacked gap structure such as a semiconductor integrated circuit device.

Subsequently, referring to FIG. 2A, a gap-fill layer 22 may be formed as a gap-fill material on the surface of the gap structure including the gap 21. The gap-fill layer 22 may be formed to a desired thickness with a uniform thickness on the exposed surface of the gap structure. As the material of the gap-fill layer 22, various materials such as an insulating layer or a conductive layer may be used according to the need of the gap-fill process. The gap fill layer 22 may be formed in a layer-by-layer manner by an atomic layer deposition (ALD) method, for example, in an atomic layer unit. The atomic layer deposition method is a technique that may deposit an ultra-thin film with the level of an atomic layer thickness in each cycle while alternately exposing precursors and reactants, which are raw materials for thin films, on the surface of the substrate in a vacuum state. Since the method proceeds by self-limited surface chemical reaction, there is an advantage in that the thickness of the deposited material may be finely controlled, and the high-quality thin film may be conformally deposited. However, the atomic layer deposition method may also have a disadvantage in that the film forming rate of the thin film is slow.

Referring to FIG. 2B, a deposition inhibitor may be supplied to the substrate 20 in which the gap structure is formed. As the deposition inhibitor, at least one or a mixture of nitrogen-containing gases, such as $N_2$, $NH_3$, $N_2+H_2$, may be used. In addition, as the deposition inhibitor, at least one or a mixture of fluorine-containing gases, such as $NF_3$, $F_2$, $CF_4$, $BrF_3$, $SF_6$, and $ClF_3$ may be used. The nitrogen-containing gas or fluorine-containing gas used as the deposition inhibitor may be used to form a deposition inhibiting region in an upper region of the gap 21, in which the deposition of the gap-fill layer 22 may be inhibited due to a high reducing power thereof.

Referring to FIG. 2C, as a deposition step of the gap-fill layer 22 of FIG. 2A (also referred to as a first sub-cycle) and a deposition inhibiting step of supplying the deposition inhibitor of FIG. 2B (also referred to as a second sub-cycle) are repeatedly performed, that is, as a super-cycle including the first sub-cycle and the second sub-cycle is repeatedly performed, the thickness of the gap-fill layer 22 filling the inside of the gap 21 may gradually increase. In the present disclosure, one super-cycle is not necessarily defined as consisting of one first sub-cycle and subsequent one second sub-cycle, and thus one super-cycle may include a plurality of first sub-cycles and/or a plurality of second sub-cycles, and a detailed description thereof will be described later.

As shown in FIG. 2C, the thickness of the gap-fill layer 22 may be formed relatively conformally in the lower region of the gap 21, but in the upper region of the gap 21, the formation of the gap-fill layer 22 may be inhibited and thus the deposited gap-fill layer 22 may have approximately V-shape. That is, a width W1 in an inlet region of the gap 21 may be greater than a width W2 in the lower region of the gap 21.

As such, when the gap fill layer 22 is formed while keeping the width W1 in the inlet region of the gap 21 greater than the width W2 in the lower region of the gap 21, source gases or reaction gases to be used for the atomic layer deposition method may be transferred smoothly to bottom and sidewall surfaces of the lower region of the gap 21, thereby, the gap-fill layer 22 may be smoothly deposited in the lower region of the gap 21.

Referring to FIG. 2D, as the super-cycle including the first sub-cycle depositing the gap-fill layer 22 and the second sub-cycle inhibiting the deposition of the gap-fill layer 22 is repeatedly performed while keeping the width W1 in the inlet region of the gap 21 greater than the width W2 in the lower region of the gap 21, an interior of the gap 21 may be fully filled without the occurrence of voids. On the other hand, when the super-cycle step is repeated a certain number of times and the occurrence of voids in the gap is not concerned, only the first sub-cycle step may be repeated to speed up the deposition rate of the gap-fill layer 22.

Referring to FIG. 2E, after an interior of the gap 21 is fully filled, the gap-fill layer 22 remaining around the gap 21 may be removed for the planarization of the surface of the substrate 20 through an etch back process, etc., and thus, the gap-fill process may be completed.

Figure 3A:
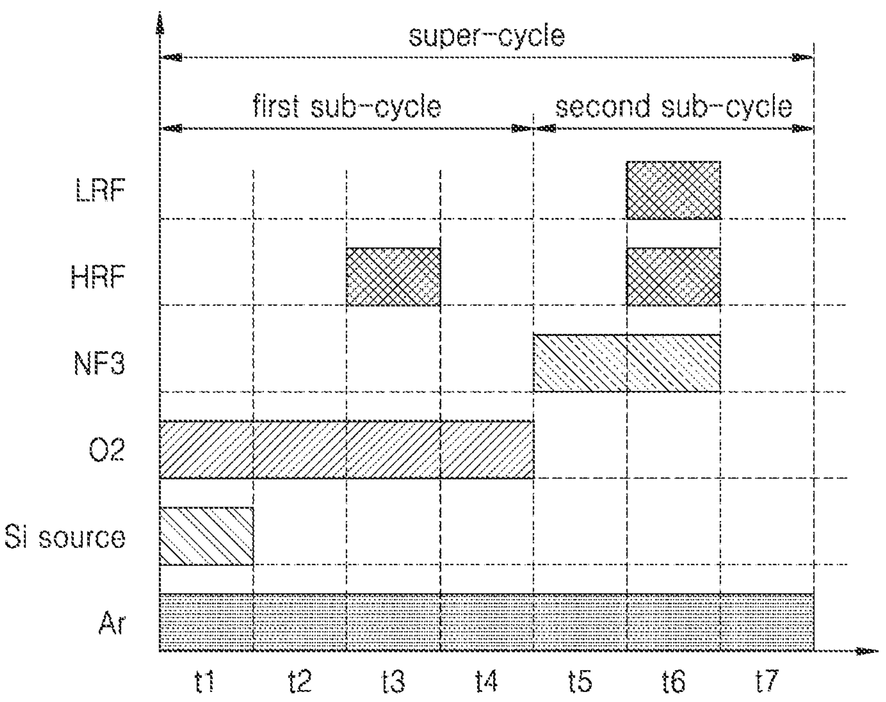
FIG. 3A is a diagram illustrating a process sequence of a gap-fill process according to example embodiments of the present disclosure.

FIG. 3A is a diagram illustrating a process sequence of a gap-fill process according to example embodiments of the present disclosure. FIG. 3A is a diagram schematically sequentially combining one deposition step of FIG. 2A (i.e., the first sub-cycle step) and one deposition inhibiting step of FIG. 2B (i.e., the second sub-cycle step), for convenience of explanation. Actually, if desired, only the first sub-cycle step may be repeated to a certain number of times, and only the second sub-cycle step may be repeated to a certain number of times.

Referring to FIG. 3A, the gap-fill process according to the present embodiment may be largely composed of the deposition step and the deposition inhibiting step. The present embodiment will be described based on a gap-fill process, in which the gap structure including the gap formed on the substrate, for example, a silicon substrate, is filled with a gap-fill material, for example, $SiO_2$.

The first sub-cycle which is the deposition step may correspond to t1 to t4 of FIG. 3A and may be performed through the atomic layer deposition method, for example, a plasma atomic layer deposition method. A Si source gas as a source gas and an $O_2$ gas as a reaction gas may be alternately and sequentially supplied on the substrate provided in a reaction space, and the reaction gas may be activated by high radio frequency (HRF) power and reacted with the Si source gas to form a $SiO_2$ film on the exposed surface of the substrate in which the gap is formed (See FIG. 2A). On the other hand, FIG. 3A shows that the 02 gas supplied as a reaction gas is continuously supplied throughout the first sub-cycle (t1 to t4). In this case, the oxygen reaction gas may act as a reactive purge gas, in which the oxygen reaction gas may react with the source gas only when the RF power is applied. Therefore, the oxygen gas to be supplied continuously in FIG. 3A may act as the reaction gas in a t3 period, but the oxygen gas may act as the purge gas in periods other than t3. For example, when forming a silicon oxide film, the oxygen gas may be supplied as the reactive purge gas, and when forming a silicon nitride film, a nitrogen gas may be supplied as the reactive purge gas.

On the other hand, the oxygen gas may be continuously supplied as the reactive purge gas, but in other embodiments, an inert gas, for example, an argon gas may be further supplied as the purge gas. The RF power supplied in the t3 period of the present embodiment may be the HRF power, and may be a frequency of 10 MHz or more, for example, 13.56 MHz, 27.12 MHz, or 60 MHz. The high radio frequency power may increase the ion densities of the source gas and the reaction gas to contribute to the improvement of the deposition rate. In other embodiments, a low radio frequency (LRF) power may be supplied simultaneously with the HRF power. The high radio frequency power may increase the ion densities of the source gas and the reaction gas to enhance the deposition, and the low radio frequency power may have the effect of intensifying deposition in the lower region of the gap by allowing ions to travel deeper into the gap.

Further, in the deposition step of the present embodiment, it may be desirable to keep the process pressure low to lower the probability of collision of ions and increase the average traveling distance of the ions, to allow sufficient ions to migrate and deposit to the lower region of the gap of the gap structure. For example, the process pressure in the deposition step may be preferably maintained below about 5 Torr.

The deposition step may be repeated plural times until the deposited film is formed on the surface in the gap to the desired thickness.

Then, the deposition inhibiting step which is the second sub-cycle may correspond to the t5 to t7 of FIG. 3A. In the present embodiment, nitrogen trifluoride ($NF_3$) may be used as the deposition inhibitor, and the deposition inhibitor may be pre-flowed in t5 period with argon which is the purge gas or a carrier gas. In t6 period, which is a RF power supply step, the HRF power and the LRF power may be supplied together to activate the deposition inhibitor. The HRF power of a frequency of 10 MHz or more, for example, 13.56 MHz, 27.12 MHz, or 60 MHz may be supplied. The LRF power of a frequency of 1 MHz or less, for example, 1 MHz, 430 kHz, or 300 kHz may be supplied. The HRF power is advantageous in inhibiting the deposition of the film in the upper region of the gap by increasing the ion density of fluorine ions, although the travel distance of fluorine ions is short, but the LRF power is advantageous in allowing fluorine ions to further be diffused into the gap downwardly by increasing the average travel distance of the fluorine ions.

In this embodiment, the nitrogen trifluoride ($NF_3$) is used as the deposition inhibitor, but is not limited thereto. In other embodiments, a reducing gas having reducing power may be used as the deposition inhibitor. For example, a nitrogen-containing gas or a fluorine-containing gas may be used as the deposition inhibitor. As the nitrogen-containing gas, for example, at least one of $N_2$, $NH_3$, $N_2$+$H_2$, or mixtures thereof may be used. In addition, as the deposition inhibitor, at least one or a mixture of fluorine-containing gases, such as $NF_3$, $F_2$, $CF_4$, $BrF_3$, $SF_6$, and $ClF_3$ may be used.

On the other hand, in the deposition inhibiting step, in order to minimize fluorine ions from damaging an under layer positioned below the gap, the nitrogen trifluoride may be supplied with a lower fraction in the flow rate compared to the purge gas (for example, the argon gas) to be supplied together. Further, in order to minimize fluorine ions from damaging the under layer positioned below the gap, the RF power having a lower intensity than the RF power applied in the t3 period of the deposition step may be applied, in other embodiments, for a shorter time than the t3 period of the deposition step.

On the other hand, in other embodiments, only the high radio frequency power or the low radio frequency power may be supplied according to the structure of the gap. For example, in the case of the gap structure in which the inlet region of the gap is relatively narrow, the high radio frequency power may be supplied to focus on expanding the deposition inhibiting region in the upper region of the gap. However, in the case of the gap structure in which the inlet region of the gap is relatively broad, the low radio frequency power may be supplied to focus on expanding the deposition region throughout the entire region from the upper region of the gap to the lower region thereof.

In this embodiment, an aminosilane may be used as a Si source to deposit a silicon oxide on the gap structure, but at least one of Si source gases of aminosilane series, iodosilane series, and silicon halide series may be used. For example, the Si source may include at least one of TSA, $(SiH_3)_3N$; DSO, $(SiH_3)_2$; DSMA, $(SiH_3)_2NMe$; DSEA, $(SiH_3)_2NEt$; DSIPA, $(SiH_3)_2N(iPr)$; DSTBA, $(SiH_3)_2N(tBu)$; DEAS, $SiH_3NEt_2$; DTBAS, $SiH_3N(tBu)_2$; BDEAS, $SiH_2(NEt_2)_2$; BDMAS, $SiH_2(NMe_2)_2$; BTBAS, $SiH_2(NHtBu)_2$; BITS, $SiH_2(NHSiMe_3)_2$; DIPAS, $SiH_3N(iPr)_2$; TEOS, $Si(OEt)_4$; $SiCl_4$; HCD, $Si_2Cl_6$; 3DMAS, $SiH(N(Me)_2)_3$; BEMAS, $SiH_2[N(Et)(Me)]_2$; AHEAD, $Si_2(NHEt)_6$; TEAS, $Si(NHEt)_4$; $Si_3H_8$; DCS, $SiH_2Cl_2$; $SiHI_3$; $SiH_2I_2$; trimer-trisilyamine, or its derivatives or mixtures thereof. An oxygen reaction gas may include at least one of $O_2$, $O_3$, $CO_2$, $H_2O$, $NO_2$, and $N_2O$, or mixtures thereof.

In other embodiments, when the deposited film to be deposited on the gap structure is $Si_xN_y$ or SiCN film, the reaction gas may be at least one of $N_2$, $N_2H_2$ (diimide) and $NH_3$ or mixtures thereof.

The process conditions for the deposition step and the deposition inhibiting step according to the embodiment of FIG. 3A are shown in Table 1 below.

TABLE 1

| item | | | condition |
|---|---|---|---|
| gas flow rate (sccm) | | source carrier Ar | 500-3,000 (preferably, 1,000-2,000) |
| | | purge Ar | 200-5,000 (preferably, 250-4,500) |
| | | $O_2$ | 500-2,000 (preferably, 800-1,500) |
| | | $NF_3$ | 10-100 (preferably, 15-30) |
| process time (second) | deposition step | source feed (t1) | 0.1-1.0 (preferably, 0.2-0.6) |
| | | source purge (t2) | 0.1-1.0 (preferably, 0.2-0.6) |
| | | reactant feed (t3) | 0.1-1.0 (preferably, 0.2-0.6) |
| | | reactant purge (t4) | 0.1-1.0 (preferably, 0.2-0.6) |
| | deposition inhibiting step | deposition inhibitor (t5) | 0.1-1.0 (preferably, 0.2-0.6) |
| | | RF on (t6) | 0.1-1.0 (preferably, 0.2-0.6) |
| | | purge (t7) | 0.1-1.0 (preferably, 0.2-0.6) |
| plasma condition (W) | deposition step | HRF power | 50-250 (preferably, 100-200) |
| | deposition inhibiting step | HRF power | 50-150 (preferably, 75-100) |
| | | LRF power | 50-150 (preferably, 75-100) |
| process pressure (Torr) | deposition step | | 0.5-4.0 (preferably, 1.0-3.0) |
| | deposition inhibiting step | | 0.5-4.0 (preferably, 1.0-3.0) |
| process temperature (° C.) | | | 300-550 |
| CK ratio | | | 15-40 |
| Si precursor | | | aminosilane |

Figure 3B:
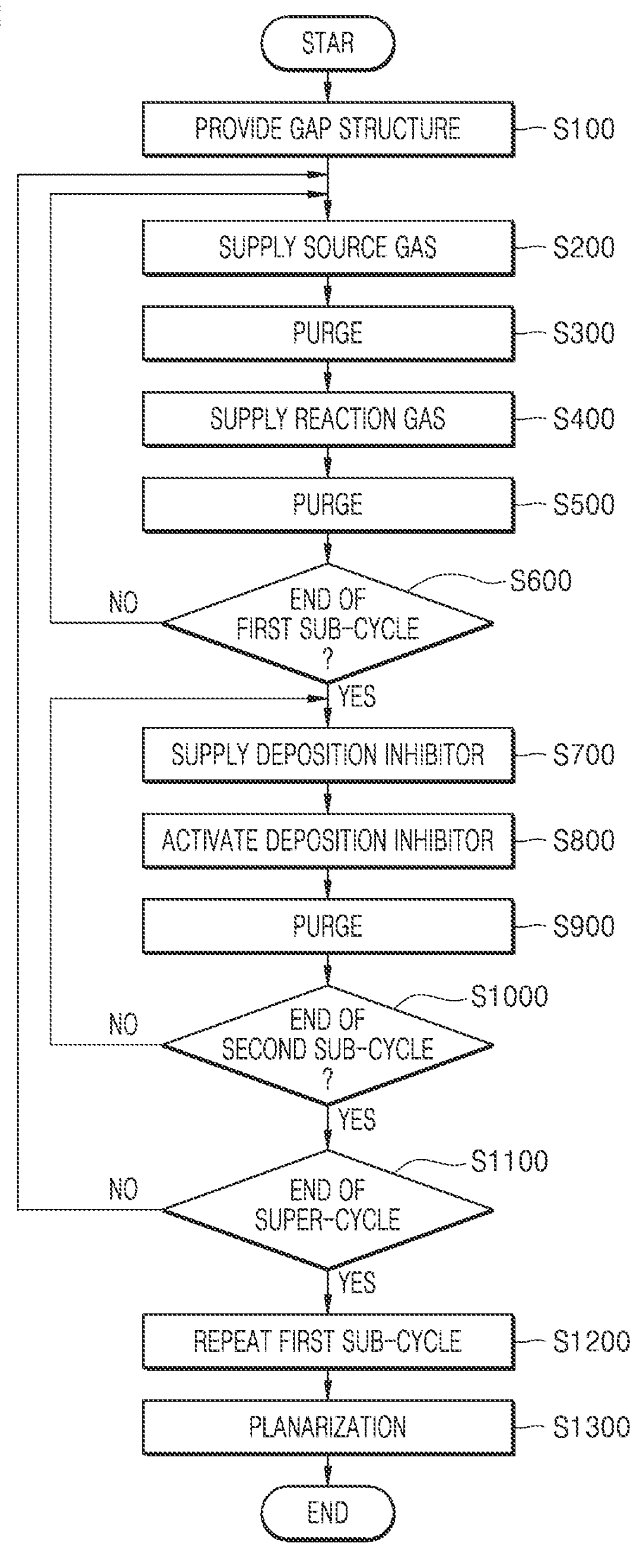
FIG. 3B is a flow diagram of a gap-fill process according to example embodiments of the present disclosure.

FIG. 3B is a flowchart of a gap-fill process according to example embodiments of the present disclosure, and will be described with reference to FIGS. 2 and 3A together.

The gap structure having the gap 21 on the substrate 20 may be provided in the reaction space (not shown) (S100). As described above, the substrate 20 may be a variety of substrates used for a semiconductor device or a display device, and the gap 21 may have a vertical profile in which the cross-sectional area of the gap 21 is constant along the vertical direction, or may have a various non-vertical profiles in which the cross-sectional area increases or decreases.

Then, the deposition step, i.e., the first sub-cycle step (S200 to S500) may be performed to form the gap-fill layer 22 shown in FIG. 2A. The first sub-cycle may include a source gas supply step (S200), a purge step (S300), a reaction gas supply step (S400), and a purge step (S500). For example, an argon gas may be continuously supplied as the carrier gas or the purge gas over the entire deposition step. The purge step (S300 or S500) may be a step of removing excess source gas or reaction gas, or reaction by-products from the reaction space. Further, as shown in FIG. 3A, a Si source gas may be supplied as the source gas and an $O_2$ gas may be supplied as the reaction gas to form a $SiO_2$ film on the surface of the gap structure. The $O_2$ gas may serve as the reaction gas when activated by the RF power, but in other periods, may be a reactive purge gas serving as the purge gas, and thus may be supplied continuously over the entire first sub-cycle.

After the number of repetitions of the first sub-cycle is set as a program in advance, it may be determined whether the first sub-cycle step ends according to whether the set number has been reached (S600). For example, when the number of first sub-cycle is set to M, the first sub-cycle may be repeatedly performed M times. When it is determined as 'NO' in whether the first sub-cycle ends, the first sub-cycle step may be repeatedly performed from the source gas supply step S200 to the purge step S500. In some embodiments, whether the first sub-cycle ends or not may be determined based on whether the thickness of the gap-fill layer 22 has reached a preset desired thickness.

When the first sub-cycle is completed, the second sub-cycle, i.e., S700 to S900, which is the deposition inhibiting step, may proceed. The second sub-cycle step may include a deposition inhibitor supply step S700, a deposition inhibitor activation step S800, and a purge step S900. The deposition inhibitor supply step S700 is a step of pre-flowing the deposition inhibitor into the reaction space. By pre-flowing the deposition inhibitor, the flow rate fluctuation of the deposition inhibitor in the reaction space may be minimized to maintain stable process conditions.

As described above, as the deposition inhibitor, for example, nitrogen trifluoride ($NF_3$) may be used, and in the deposition inhibitor activation step S800, for example, high frequency power and low frequency power may be supplied together to provide a stable plasma, thereby increasing the ion density of fluorine ions and at the same time increasing the travel distance of the fluorine ions. After the deposition inhibitor activation step S800, the excess deposition inhibitor and the reaction by-products may then be discharged into the outside of the reaction space in the purge step S900.

Then, it may be determined whether the second sub-cycle step ends or not (S1000). Whether or not the second sub-cycle ends may be determined by, for example, whether after the number of repetitions of the second sub-cycle is preset, for example, as N time in a program and then the number of repetitions of the second sub-cycle reaches N times or not. When the number of repetitions of the second sub-cycles does not reach the preset number (i.e., when it is determined as 'NO'), the process may repeat the second sub-cycle step starting from the deposition inhibitor supply step S700 of the second sub-cycle step.

Subsequently, when it is determined as "YES" in an end determination step of the second sub-cycle step (S1100), it may be determined whether the super-cycle ends (S1100). For example, when the number of first sub-cycle steps is set to M and the number of second sub-cycles is set to N, the super-cycle end determination step S1100 may determine whether both M and N have been reached. If both the number of the first and second sub-cycles preset in the program have not been reached, the process may continue from the source gas supply step S200 of the first sub-cycle step. In other embodiments, after the number of super-cycles is preset, when the number of super-cycle reaches the preset number, it may be determined whether the super-cycle ends. In other embodiments, as shown in FIG. 2D, whether the super-cycle ends may be determined whether the gap 21 of the gap structure is physically filled without the occurrence of voids. Further, whether the super-cycle ends may be determined whether the thickness of the gap fill layer 22 formed on the surface of the substrate 20 has reached a predetermined thickness.

Subsequently, if it is determined that the super-cycle step is terminated, then the first sub-cycle step may be repeated (S1200). On the other hand, the first sub-cycle repeating step S1200 may be optionally performed. But if it is determined that the desired gap fill process is completed in the super-cycle end determination step S1100, the first sub-cycle repeating step S1200 may be omitted.

On the other hand, the first sub-cycle repeating step S1200 may be actively performed. That is, after the super-cycle step is performed to a certain extent that voids no longer occur in the gap 21 in the gap structure, in order to shorten the film formation time or to fill the remaining unfilled space in the upper part of the gap, only the first sub-cycle may be performed in the gap-filling process. For example, as shown in FIG. 2D, after the gap fill layer 22 completely fills the lower region of the gap 21, only the first sub-cycle may be performed until the height of the lowermost of the gap-fill layer 22 filling the gap 21 is at least equal to or greater than the height of the surface of the substrate 20 around the gap 21.

Then, as shown in FIG. 2E, a surface planarization step S1300, for example, through the etching process, may be performed to complete the gap-fill process.

Figure 4A:
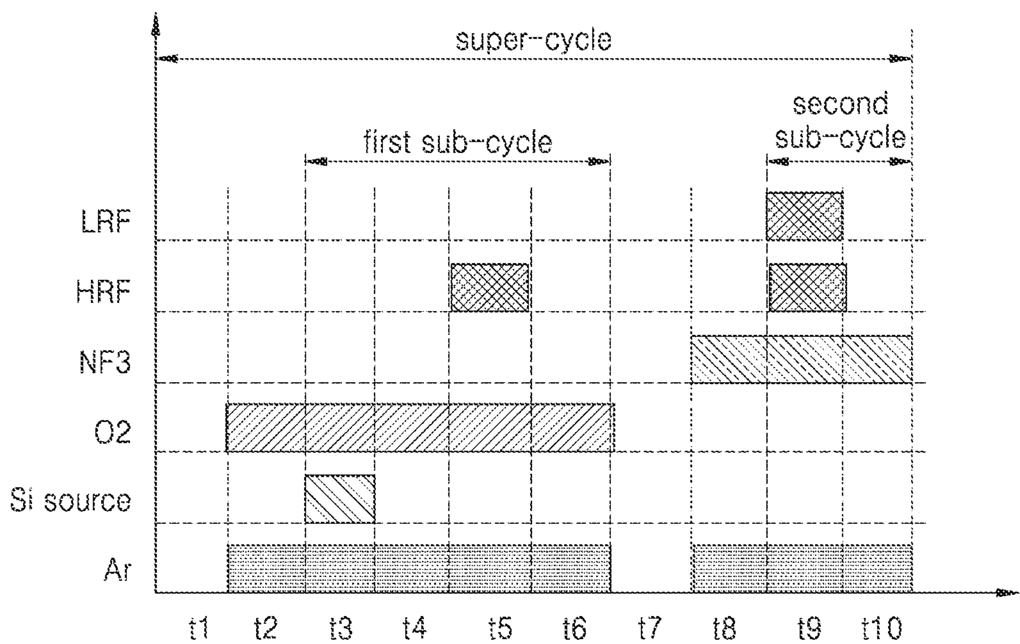
FIG. 4A is a diagram illustrating a process sequence of a gap-fill process according to another example embodiments of the present disclosure.

FIG. 4A is a diagram illustrating a process sequence of a gap-fill process according to another example embodiments of the present disclosure. FIG. 4 is basically substantially the same as the process sequence of FIG. 3A, except that it may further include a gas exchange step between the deposition step (i.e., the first sub-cycle step) of FIG. 2A and the deposition inhibiting step (i.e., a second sub-cycle step) of FIG. 2B and between the one deposition inhibiting step and a subsequent one deposition step. Therefore, the description that overlaps with the description of FIG. 3A will be omitted.

Referring to FIG. 4A, the gap-fill process according to the present embodiment may broadly consist of a first gas exchange step (t1 and t2), the first sub-cycle step (t3 to t6) which is the deposition step, a second gas exchange step (t7 and t8), and the second sub-cycle step (t9 to t10) which is the deposition inhibiting step. The t8 period may be included in the deposition inhibiting step, or may be included in the second gas exchange step.

The gas exchange step may be a step of removing the residual gas of the gas supplied in the previous step before proceeding next step and the reaction by-products thereof. That is, the second gas exchange steps (t7 and t8) may be the step of removing excess gases remaining after the reaction between the Si source gas and the 02 reaction gas supplied in the deposition step and the reaction by-products thereof, which is to reduce process interference in the subsequent deposition inhibiting step. The second gas exchange step may include a vacuum purge step (t7) and a reaction gas pre-flow step (t8). In the vacuum purge step, the supply of gas into the reaction space may be stopped and then the residual gas remaining in the reaction space and the gap structure of the substrate may be removed by the vacuum suction force of an exhaust device, for example, an exhaust pump. In the reaction gas pre-flow step, gases to be supplied in the subsequent step may be supplied into the reaction space in advance. By pre-flowing the reaction gas, the process conditions in the reaction space may be more stably maintained by reducing pressure fluctuations or flow rate fluctuations in the reaction space in the subsequent gap-fill process. For example, by pre-flowing $NF_3$ gas, which is a deposition inhibitor, in the t8 period of the gas pre-flow step in FIG. 4A, the flow rate fluctuations of $NF_3$ gas in the reaction space may be minimized during the deposition inhibiting step to form a more stable plasma to activate the deposition inhibitor.

The first gas exchange steps (t1 and t2) may be included additionally or optionally after the deposition inhibiting step and before the deposition step. Since the super-cycle including the deposition step of the first sub-cycle and the deposition inhibiting step of the second sub-cycle is performed multiple times in the gap-fill process, and since the deposition step is continuously performed after the deposition inhibiting step, the first gas exchange step may be performed. Specifically, in the first gas exchange step, by removing the residual gas and the reaction by-products of the $NF_3$ used in the deposition inhibiting step in the vacuum purge step (t1 period), the interference by these materials in the subsequent deposition step may be reduced, and by pre-flowing the 02 reaction gas in the reaction gas pre-flow step (t2), the pressure fluctuations or flow fluctuations in the deposition step may be reduced to form stable process conditions and thus to perform a stable deposition step.

Meanwhile, in the present disclosure, the deposition step may be continuously repeated multiple times, in this case, the gas exchange step may be included additionally or optionally between the deposition step and the next deposition step. That is, in FIG. 4A, t1 to t6 may be repeatedly performed. In the same sense, the deposition inhibiting step may be performed continuously repeatedly. That is, t7 to t10 may be repeatedly performed, but the effect thereof will be described later.

On the other hand, in the reaction gas pre-flow steps t2 and t8 of the first and second gas exchange steps, $O_2$ or $NF_3$, which is a reaction gas may gradually increase. For example, the supply amount of the reaction gas may increase linearly from 0 sccm to the desired flow rate, or the supply amount may increase in a stepwise manner. In some embodiments, the gas exchange step may be performed for about 3 seconds to about 10 seconds. For example, the vacuum purge steps t1 and t7 may be performed for about 2 seconds to about 9 seconds, and the reaction gas pre-flow steps t2 and t8 may be performed for about 1 second to about 8 seconds.

Figure 4B:
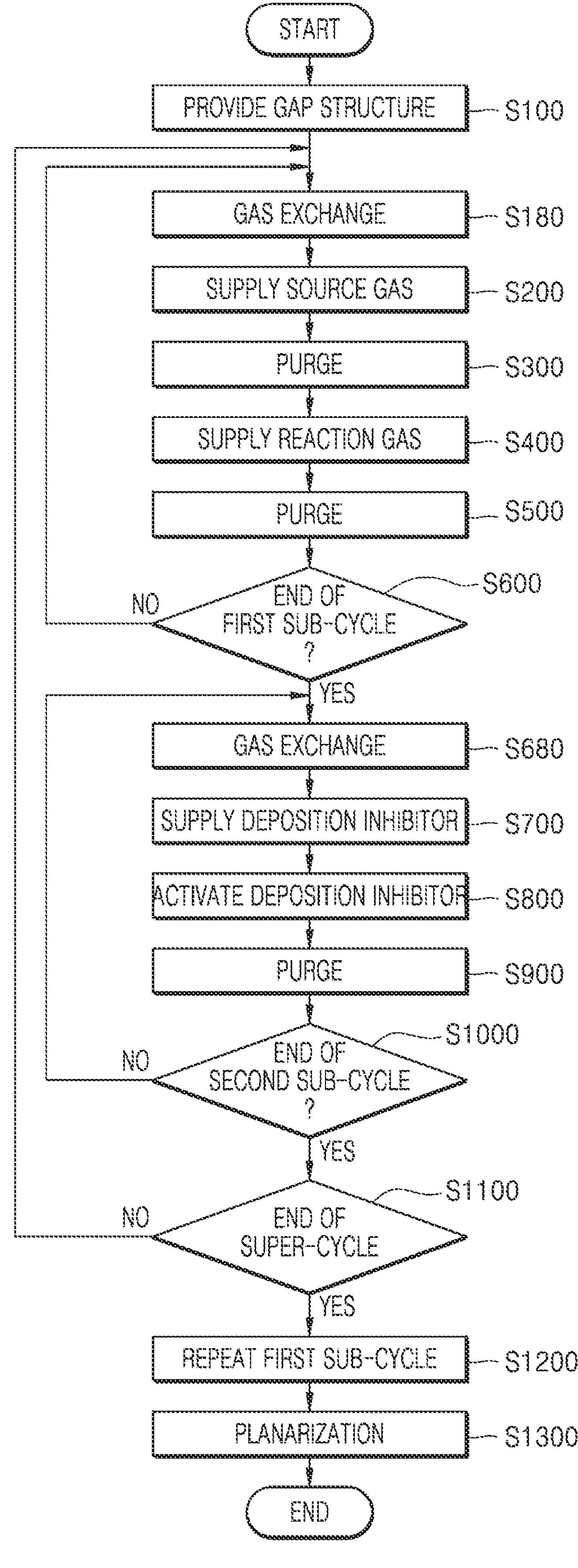
FIG. 4B is a flow diagram of a gap-fill process according to another example embodiments of the present disclosure.

FIG. 4B is a flow diagram of a gap-fill process according to another example embodiments of the present disclosure.

Referring to FIG. 4B, the flow of the gap-fill process is shown in connection with the process sequence of FIG. 4A, and is generally the same as the process flow diagram of FIG. 3B except for gas exchange steps S180 and S680. Therefore, a description overlapping the description of the process flow diagram of FIG. 3B will be omitted.

The first gas exchange step t1 and t2 of FIG. 4A may correspond to the gas exchange step S180 and may be performed immediately before the source gas supply step S200. Further, the vacuum purge step t7 in the second gas exchange step may correspond to the gas exchange step S680 and may be performed immediately before the deposition inhibitor supply step S700. The reaction gas pre-flow step t8 in the second gas exchange step may be the same as the deposition inhibitor supply step S700 of FIG. 4B, or may be performed separately from the deposition inhibitor supply step S700 of FIG. 4B.

Hereinafter, the main factors that may affect the methods of the present disclosure, which may fill the gap without the occurrence of voids within the gap 21 in the gap-fill process of FIG. 2, will be discussed in detail.

Figure 5:
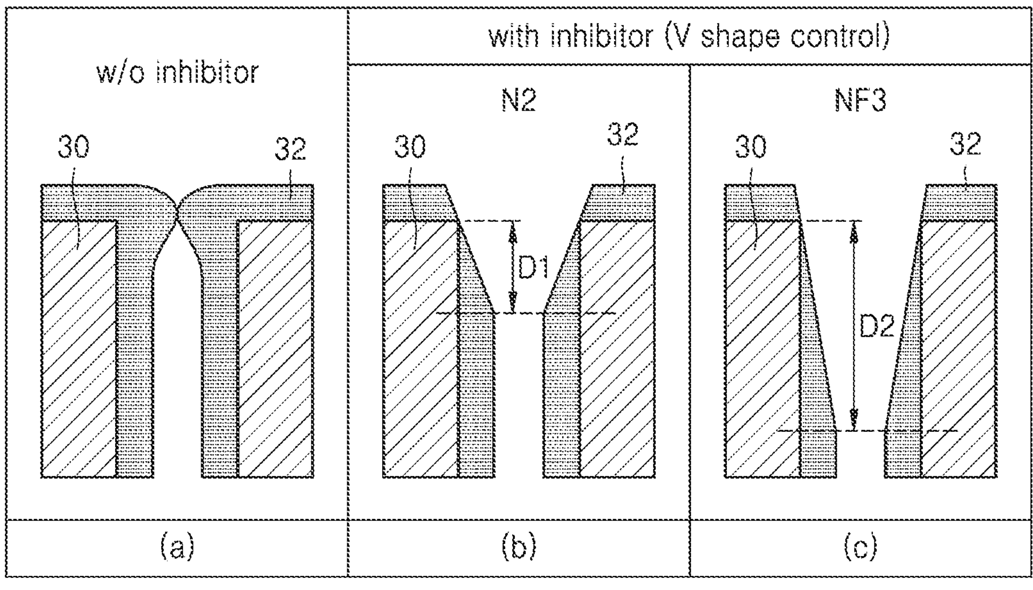
FIG. 5 is a diagram comparing deposition profiles according to whether or not a deposition inhibitor is used in a gap-fill process according to example embodiments of the present disclosure.

FIG. 5 is a diagram comparing deposition profiles according to whether or not a deposition inhibitor is used in a gap-fill process according to example embodiments of the present disclosure. In FIG. 5, (a) is a cross-sectional view of an upper region of the gap when the deposition inhibitor is not used, (b) is a cross-sectional view of the upper region of the gap when $N_2$ is used as the deposition inhibitor, wherein the number of repetitions of the deposition step vs the number of repetitions of the deposition inhibiting step is 1:1, and (c) is a cross-sectional view thereof when $NF_3$ is used as the deposition inhibitor, wherein the number of repetitions of the deposition step vs the number of repetitions of the deposition inhibiting step is more than 10:1. FIG. 5 parts (b) and (c) show respectively depths D1 and D2 representing the depth of the deposition inhibiting end point in each case, wherein a region where the deposition is inhibited from the upper region of the gap to the deposition inhibiting end point may be referred to as a deposition inhibiting region.

FIG. 5 part (a) shows that a void is formed in the gap due to the occurrence of an overhang in the inlet region of the gap of the substrate 30 when the gap-fill process is performed in the atomic layer deposition method without performing the deposition inhibiting step in FIG. 2B in the gap-fill process of FIG. 2. On the other hand, in FIG. 5, parts (b) and (c) show vertical profiles of the gap-fill layer 32 in the upper region of the gap when nitrogen and nitrogen trifluoride are used in the deposition inhibiting step, respectively. When nitrogen is used as the deposition inhibitor, the deposition in the upper region of the gap may be inhibited, so that the upper region of the gap has a V-shaped profile in which the cross-sectional area of the upper region of the gap is wider than that of the lower region, and thus a bottom-up gap-fill process may be performed without the occurrence of voids inside the gap.

When nitrogen trifluoride is used as the deposition inhibitor, as shown in FIG. 5 part (c), the deposition in the upper region of the gap may also be inhibited, so that the upper region of the gap has the V-shaped profile in which the cross-sectional area of the upper region of the gap is wider than that of the lower region, and thus the bottom-up gap-fill process may be performed without the occurrence of voids inside the gap. However, since a fluorine component has a stronger reducing power than a nitrogen component, the deposition inhibiting power when nitrogen trifluoride is used as the deposition inhibitor is higher than when nitrogen is used, so that the deposition inhibiting region is wider and deeper in the gap-fill process. Therefore, it may be seen that the use of the nitrogen trifluoride is more advantageous in the bottom-up gap-fill process.

On the other hand, in the case of FIG. 5 part (b) using nitrogen as the deposition inhibitor, the number of repetitions of the deposition step vs the number of repetitions of the deposition inhibiting step is 1:1, whereas in the case of (c) using nitrogen trifluoride, the number of repetitions of the deposition step vs the number of repetitions of the deposition inhibiting step is more than 10:1. Therefore, when using nitrogen trifluoride as the deposition inhibitor, in addition to the relatively larger width and depth of the deposition inhibiting region, the relatively high ratio of the deposition step may allow the gap-fill process to proceed faster, resulting in shortening the substrate processing time.

Figures 6A, 6B, 6C:
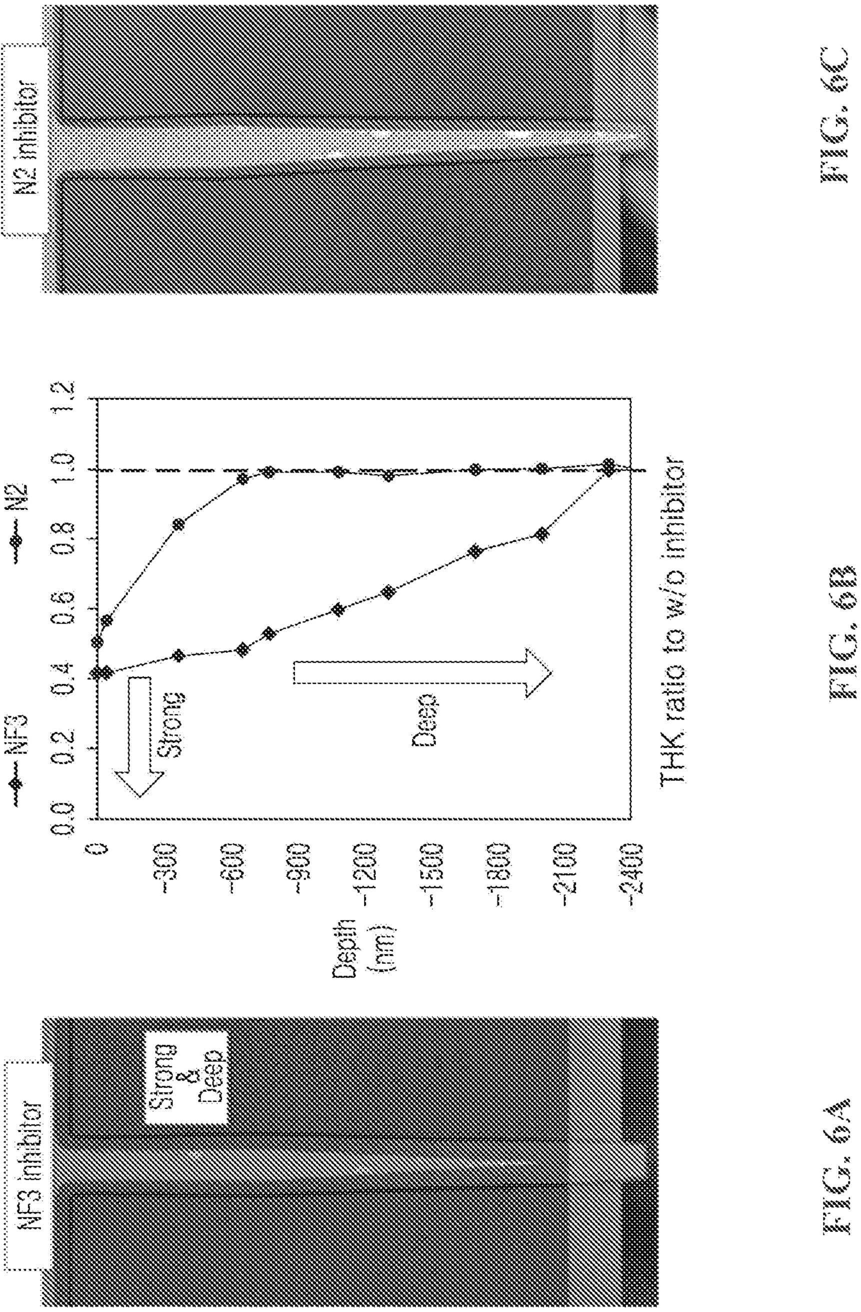
FIGS. 6A-6C are diagrams comparing deposition profiles according to the type of deposition inhibitor in a gap-fill process according to example embodiments of the present disclosure.

FIG. 6 is a diagram comparing deposition profiles according to the type of deposition inhibitor in a gap-fill process according to example embodiments of the present disclosure. FIG. 6A is a vertical profile photograph of a deposited film formed on a gap structure when using nitrogen trifluoride as the deposition inhibitor, FIG. 6C is the vertical profile photograph of the deposited film formed on the gap structure when using nitrogen as the deposition inhibitor, and FIG. 6B is a graph relatively comparing the thickness of the deposited films formed on sidewalls of the gaps along the depth of the gap with respect to the cases where using nitrogen trifluoride and where using nitrogen as the deposition inhibitor, respectively, based on the case where not using the deposition inhibitor, that is, where the deposition inhibiting step is not performed.

In FIG. 6B, an upper horizontal axis indicates the relative thickness of the deposited film based on the thickness of the deposited film formed on the gap structure when the deposition inhibitor is not used, and a vertical axis indicates the depth of the deposition inhibiting region in the gap structure. For example, the thickness of the deposited film when the deposition inhibitor is not used was set to 1.0 as a standard, and based on the standard, the thicknesses of deposited films formed on the sidewalls of the gap when the deposition inhibiting step is respectively performed by using nitrogen and nitrogen trifluoride as the deposition inhibitor are relatively compared.

Both when using nitrogen as the deposition inhibitor and when using nitrogen trifluoride as the deposition inhibitor showed an effect of inhibiting deposition because the thickness of deposited film is relatively small compared to when the deposition inhibitor is not used. On the other hand, compared to when using nitrogen as the deposition inhibitor, the thickness of the deposited film in the upper region of the gap when using nitrogen trifluoride as the deposition inhibitor is relatively smaller due to the high deposition inhibiting power of nitrogen trifluoride.

On the other hand, the effect of inhibiting deposition may appear to a certain depth toward the lower region of the gap, and a point at which the thickness of the deposited film becomes equal to the thickness thereof when the deposition inhibitor is not used may be defined as a deposition inhibiting end point. The deposition inhibiting end point may be formed at a deeper position in the lower region of the gap, because the deposition inhibiting power extends deeper into the gap when using nitrogen trifluoride as the deposition inhibitor than when using nitrogen as the deposition inhibitor. On the other hand, since the high deposition inhibiting power of nitrogen trifluoride may excessively inhibit deposition even to the gap, if excessively, the high deposition inhibiting power may adversely affect the gap-fill process or may not achieve the desired purpose as the deposition inhibitor, therefore, it would be desirable for the deposition step and the deposition inhibiting step to be performed at an appropriate ratio.

FIG. 7 is a diagram conceptually comparing deposition profiles according to the magnitude of repetition ratio of first sub-cycle (i.e., the deposition step) to second sub-cycle (i.e., the deposition inhibiting step) for the non-vertical gap in the gap-fill process according to example embodiments of the present disclosure.

The deposition step (i.e., the first sub-cycle step) and the deposition inhibiting step (i.e., the second sub-cycle step) may be repeatedly performed at a constant ratio. In the present specification, the repetition ratio of the deposition step and the deposition inhibiting step may be defined as CK (Control KNOB). For example, when referred to as CK=20 in the gap-fill process of the present disclosure, the deposition step (t1 to t4 in FIG. 3A) is repeated 20 times (i.e., M=20) and the deposition inhibiting step (t5 to t7 in FIG. 3A) is performed 1 time (i.e., N=1), which constitutes one super-cycle. The gap-fill process may be performed while this super-cycle is repeated a plurality of times.

Figures 7A, 7B:
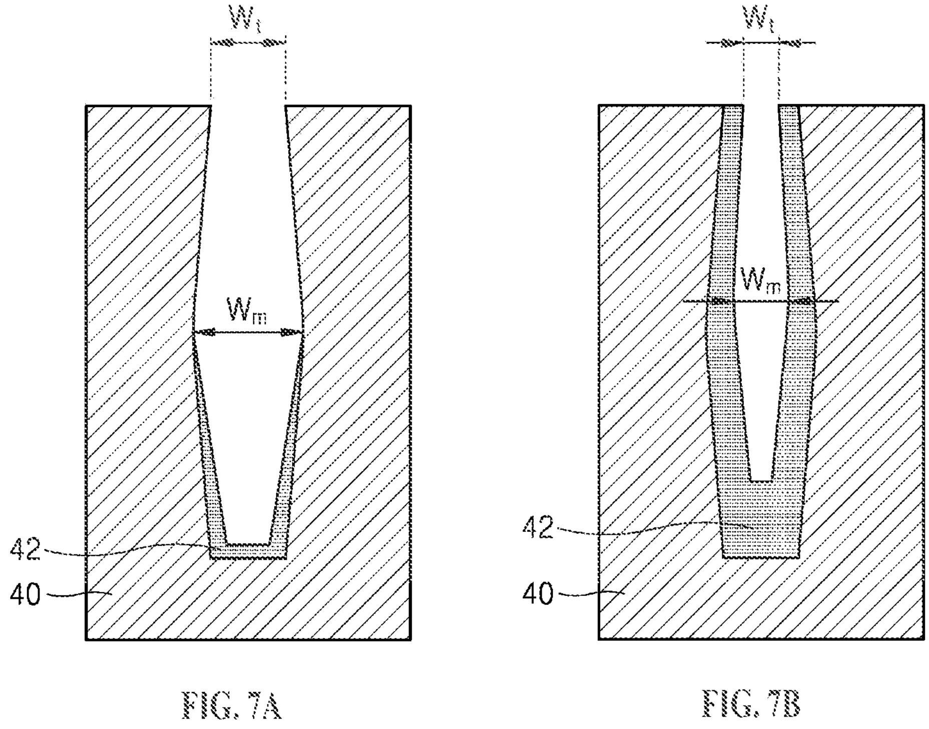
FIGS. 7A and 7B are diagrams conceptually comparing deposition profiles according to the magnitude of a repetition ratio of the number of the first sub-cycle to the number of the second sub-cycle for a non-vertical gap in a gap-fill process according to example embodiments of the present disclosure.

FIG. 7A shows a case where the repetition ratio CK value is too low, and when the CK value is too low, the number of the deposition inhibiting steps may increase relatively and therefore the times of supply of fluorine ions and the supply flow rate thereof may also increase relatively, so that more fluorine ions may be diffused into the lower region of the gap, and thus the deposition inhibiting region may be excessively expanded toward the lower region of the gap. Therefore, the 'V-shaped' deposited film in the upper region and sidewalls of the gap structure may disappear, and the gap-fill layer 42 may be formed only in the lower region of the gap. Thus, the ratio Wt/Wm of the width Wt of the gap in the upper region and the width Wm of the gap in the middle region may be 1.0 or less, so that the bottom-up gap-fill process may be impossible, and voids may occur in the gap structure after the gap-fill process.

FIG. 7B shows a case where the repetition ratio CK value is too high, and when the CK value is too high, the number of the deposition inhibiting steps may decrease relatively and therefore the times of supply of fluorine ions and the supply flow rate thereof may also decrease relatively, so that the deposition inhibiting region and its width in the upper region of the gap may become small and thus the upper region of the gap may be closed first. In this case, the ratio Wt/Wm of the width Wt of the gap in the upper region and the width Wm of the gap in the middle region may be 1.0 or less, so that the bottom-up gap-fill process may be impossible, and voids may occur in the gap structure after the gap-fill process.

When the CK value is both too low and too high, voids may occur in the gap structure in the gap-fill process, so that the gap-fill process may not be performed smoothly without the occurrence of the void.

FIG. 8 is a diagram comparing deposition profiles according to the magnitude of repetition ratio of the first sub-cycle to the second sub-cycle in the gap-fill process according to example embodiments of the present disclosure, compared to a case in which a deposition inhibitor is not used.

Figures 8A, 8B, 8C:
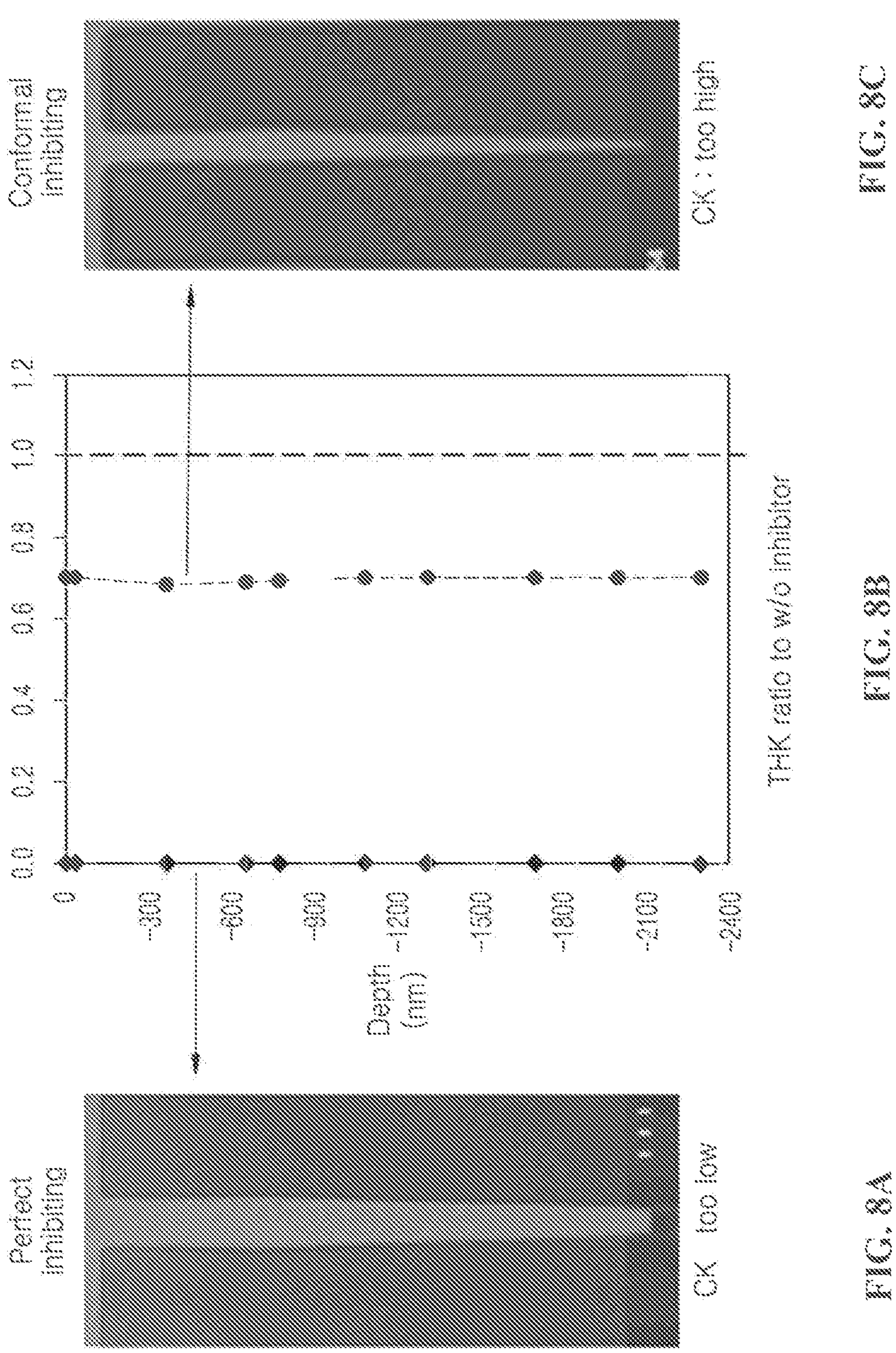
FIGS. 8A-8C are diagrams of deposition profiles according to the magnitude of a repetition ratio of the number of the first sub-cycle to the number of the second sub-cycle in a gap-fill process according to example embodiments of the present disclosure compared to a case in which a deposition inhibitor is not used.

FIG. 8A is a photograph showing the shape of the deposited film when the CK value is too low, FIG. 8C is a photograph showing the shape of the deposited film when the CK value is too high, and FIG. 8B is a graph comparing the relative thickness of the deposited film deposited on the sidewall of the gap based on the case where the deposition inhibitor is not used, that is, the deposition inhibiting step is not performed.

In FIG. 8B, an upper horizontal axis indicates the relative thickness of the deposited film based on the thickness of the deposited film formed on the gap structure when the deposition inhibitor is not used, and a vertical axis indicates the depth of the gap in the gap structure. For example, the thickness of the deposited film in the case when the deposition inhibitor is not used was set to 1.0 as a standard, and based on this, the thicknesses of the deposited films when the CK value is excessively low and when the CK value is excessively high were relatively compared.

When the CK value is excessively high, for example, when the deposition step is repeated 40 times or more and the deposition inhibiting step is performed once (i.e., CK≤40), the contribution of the deposition step may be dominant, and thus the thickness of the deposited film was constant from the upper region to the low region of the gap. Therefore, since in this case, the deposited film profile of V-shaped shape may not be obtained, in order to obtain the deposited film profile of V-shaped shape, in which the width of the gap (or cross-sectional area) in the upper region is kept wider than that in the lower region, a suitable CK value may be required.

When the CK value is excessively low, for example, when the deposition step is repeated 10 times or less and the deposition inhibiting step is performed once (i.e., CK≤10), the contribution of the deposition inhibiting step may be dominant, and thus the deposition inhibiting region may be enlarged from the upper region of the gap to the lower region thereof not to form the deposited film or to form a very thin deposited film. Therefore, the deposited film profile of V-shaped shape may not be obtained. Therefore, in order to obtain the deposited film of V-shaped shape, in which the width of the gap (or cross-sectional area) in the upper region is kept wider than that in the lower region, a suitable CK value may be required.

FIG. 9 is a diagram comparing deposition profiles according to the magnitude of repetition ratio of the first sub-cycle to the second sub-cycle in the gap-fill process according to example embodiments of the present disclosure, compared to the case in which a deposition inhibitor is not used. That is, FIG. 9 shows the width and depth of the deposition inhibiting region and the shape of the deposited film in the gap structure, according to the CK value.

Figures 9A, 9B, 9C:
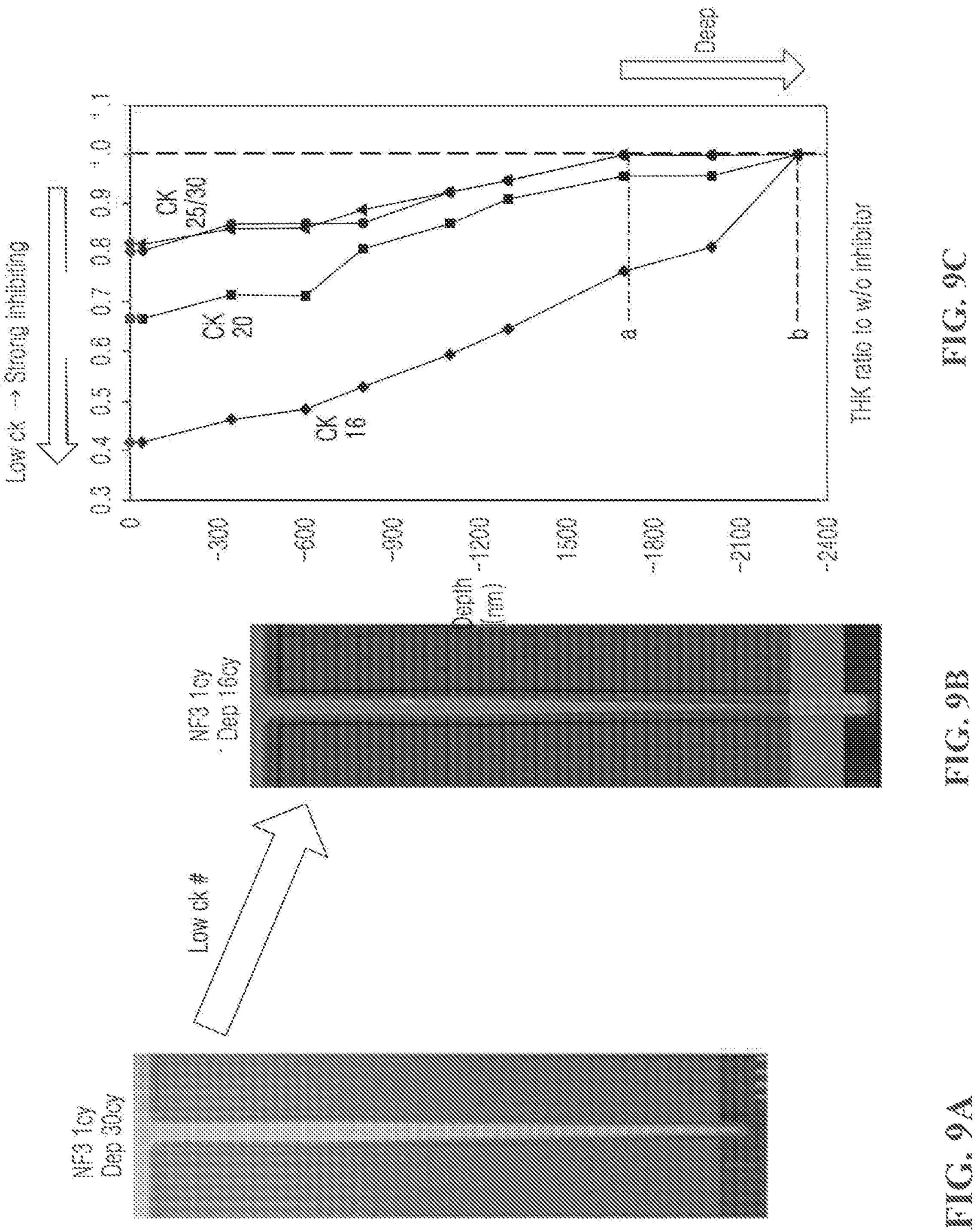
FIGS. 9A-9C are diagrams of deposition profiles according to the magnitude of a repetition ratio of the number of the first sub-cycle to the number of the second sub-cycle in a gap-fill process according to example embodiments of the present disclosure compared to a case in which a deposition inhibitor is not used.

FIG. 9A shows a case of CK=30, FIG. 9B shows a case of CK=16, and FIG. 9C shows a graph comparing the relative thickness of the deposited film based on the case when the deposition inhibitor is not used, that is, when the deposition inhibiting step is not performed. In FIG. 9C, an upper horizontal axis indicates the relative thickness of the deposited film based on the thickness of the deposited film formed on the gap structure when the deposition inhibitor is not used, and a vertical axis indicates the depth of the gap in the gap structure. For example, the thickness of the deposited film in the case when the deposition inhibitor is not used was set to 1.0 as a standard, and based on this, the thicknesses of the deposited films according to the CK value was relatively compared. On the other hand, since the horizontal axis indicates the relative thickness of the deposited film, the region having a smaller thickness than the deposited film in the case where the deposition inhibitor is not used may be referred to as the width of the deposition inhibiting region, and thus the vertical axis may indicate the depth of the deposition inhibiting region in the depth of the gap.

On the other hand, as the width of the deposition inhibiting region decreases with the depth of the gap, the width of the deposition inhibiting region may approximately coincide with the case in which the deposition inhibitor is not used, which is a reference for relative comparison, and this point may be referred to as the deposition inhibiting end point. Therefore, the smaller the CK value, the deeper the deposition inhibiting end point moves into the lower region of the gap. In the drawing, when CK=30, the deposition inhibiting end point is indicated by 'a', when CK=16, the deposition inhibiting end point is indicated by 'b'. Therefore, as the deposition inhibiting end point moves to the lower region in the gap, the depth of the deposition inhibiting region may increase.

As a result, the width and depth of the deposition inhibiting region may be adjusted according to the CK value, and thus by adjusting the CK value, the shape of the deposited film to be deposited in the gap of the gap structure may be controlled, for example, in the V-shape.

In the above-described embodiments, in the step of repeating the super-cycle, the repetition ratio of the number of first sub-cycle to the number of second sub-cycle is kept constant, but in other embodiments, the step of repeating the super-cycle may be performed while gradually increasing or gradually decreasing the repetition ratio of the number of first sub-cycle to the number of second sub-cycle.

Figures 10A, 10B, 10C, 10D:
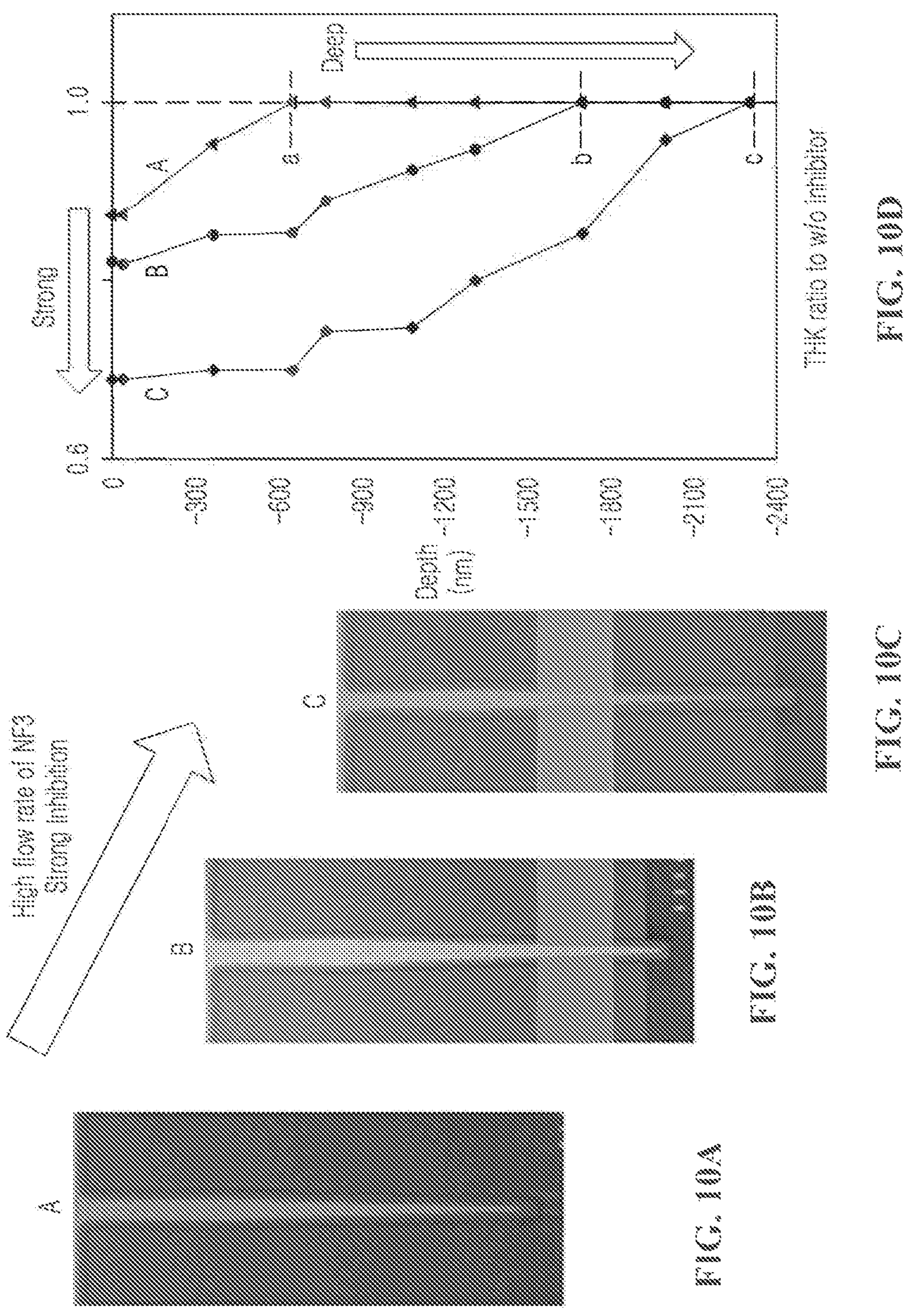
FIGS. 10A-10D are diagrams comparing deposition profiles according to the fraction of flow rate of a deposition inhibitor to argon in a gap-fill process according to example embodiments of the present disclosure.

FIG. 10 is a diagram comparing deposition profiles according to flow fractions of argon: deposition inhibitor in a gap-fill process according to example embodiments of the present disclosure. FIG. 10 shows the width and depth of the deposition inhibiting region according to the flow rate of the nitrogen trifluoride to be supplied as the deposition inhibitor, when CK=30. FIG. 10 shows that the flow rate of the $NF_3$ increases from A to C, indicating a case of Ar:$NF_3$=160:1 in FIG. 10A, a case of Ar:$NF_3$=80:1 in FIG. 10B, and a case of Ar:$NF_3$=53.1:1 in FIG. 10C, respectively. The upper horizontal axis of FIG. 10D indicates the relative thickness of the deposited film based on the thickness of the deposited film formed on the gap structure when the deposition inhibitor is not used, and the vertical axis indicates the depth of the gap in the gap structure. For example, the thickness of the deposited film when the deposition inhibitor is not used was set to 1.0 as the standard, and based on the standard, the thickness of the deposited film according to the CK value was relatively compared. The width of the deposition inhibiting region may be seen from the upper horizontal axis of FIG. 10D, and the depth of the deposition inhibiting region may be seen from the vertical axis thereof.

As seen from FIG. 10, as the flow rate fraction of nitrogen trifluoride to argon to be supplied together increases, that is, the flow rate of nitrogen trifluoride to be supplied in the reaction space increases, the deposition inhibiting end points move deeper into the lower region of the gap (that is, a<b<c), thereby increasing the width and depth of the deposition inhibiting region. Therefore, by adjusting the flow rate of the deposition inhibitor or the fraction of flow rate of the deposition inhibitor to the purge gas, the vertical position of the deposition inhibiting end point and the shape of the gap-fill layer formed on the sidewall of the gap may be controlled to be suitable for the gap-fill process on the gap structure.

Figure 11:
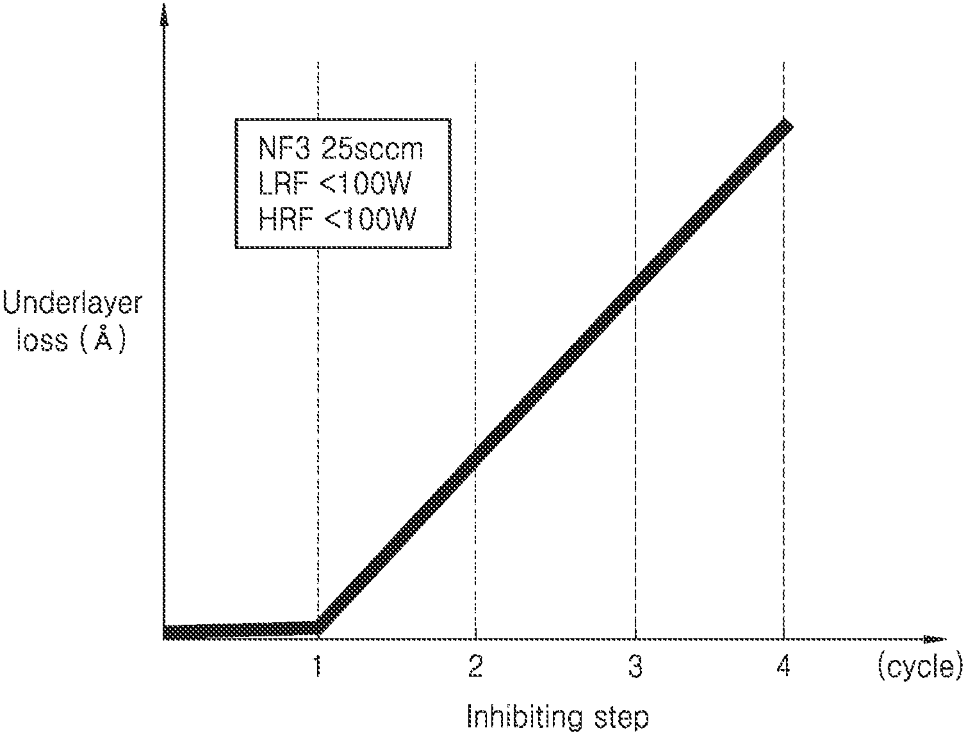
FIG. 11 is a diagram illustrating the loss of an under layer according to the number of second sub-cycle according to example embodiments of the present disclosure.

FIG. 11 is a diagram illustrating the loss of an under layer according to the number of second sub-cycle according to example embodiments of the present disclosure.

FIG. 11 shows the degree of loss of the under layer according to the number of repetitions of the deposition inhibiting step when 25 sccm of nitrogen trifluoride is supplied while supplying a low frequency power of 100 W or less in the deposition inhibiting step. In FIG. 11, when the deposition inhibiting step is performed once, the degree of loss of the under layer was insignificant, but when the deposition inhibiting step is performed twice or more in succession, it may be seen that a sudden loss of the under layer occurs. Therefore, as the deposition inhibitor, the nitrogen trifluoride exhibits a high activity, and thus in order to minimize the loss of the under layer, it may be preferable to proceed with a low RF power and one repetition number in the deposition inhibiting step. For example, in one embodiment, when CK=20, the deposition step may be performed in 20 cycles and the deposition inhibiting step may be performed in 1 cycle, and the RF power supplied to the deposition inhibiting step may be 100 W or less.

Figures 12A, 12B:
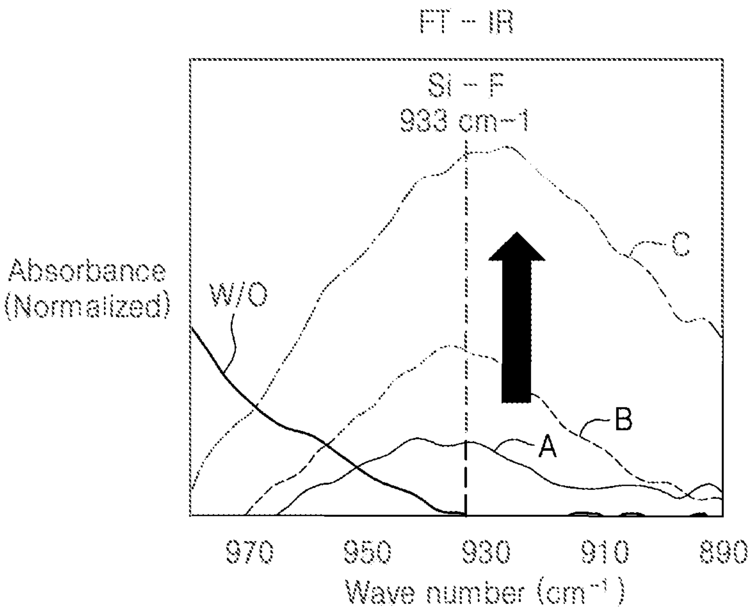
FIGS. 12A and 12B are diagrams for explaining the degree of deposition inhibition according to a flow rate of a deposition inhibitor and an RF power according to example embodiments of the present disclosure.

FIG. 12 is a diagram for explaining the degree of deposition inhibition according to a flow rate of a deposition inhibitor and an RF power according to example embodiments of the present disclosure, and FIG. 12A are process conditions and FIG. 12B is a FT-IR comparison diagram according to the process conditions of FIG. 12A.

FIG. 12A shows process conditions of a case of 'W/O' in which there is no the deposition inhibitor, a case of 'A' in which the $NF_3$ flow rate is a sccm and the $NF_3$ HRF power is m W, a case of 'B' in which the $NF_3$ flow rate is b sccm and the $NF_3$ HRF power is m W, and a case of 'C' in which the $NF_3$ flow rate is b sccm and the $NF_3$ HRF power is n W, and FIG. 12B shows the degrees of Si—F bond formed on the substrate for each process condition with Fourier Transform Infrared Spectroscopy (FT-IR). Wherein $a<b$, $m<n$.

From FIG. 12B, as the flow rate of the nitrogen trifluoride increases (A vs B, $a<b$), and the applied RF power increases (B vs C, $m<n$), it may be seen that the peak size of Si—F formed on the substrate increases. That is, as the flow rate of the nitrogen trifluoride increases, and the applied RF power increases, it may be seen that the effect of deposition inhibition may be strengthened.

Figure 13:
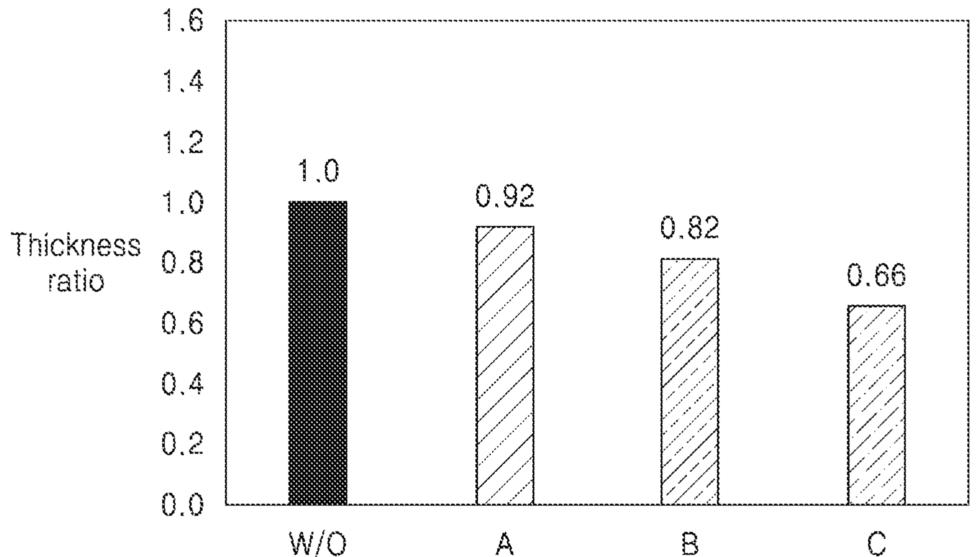
FIG. 13 is a diagram comparing relative thicknesses of deposited films according to the process conditions of FIG. 12A, according to example embodiments of the present disclosure.

FIG. 13 is a diagram comparing relative thicknesses of deposited films according to the process conditions of FIG. 12A, according to example embodiments of the present disclosure.

Referring to FIG. 13, when the thickness of the $SiO_2$ film deposited on the substrate when the nitrogen trifluoride is not supplied is set 1.0 as the standard, and based on this standard, the relative thicknesses of the $SiO_2$ film deposited under each condition of A, B, C, are shown. From FIG. 13, it may be seen that as the flow rate of the nitrogen trifluoride increases (i.e., from A to B), and the applied RF power increases (i.e., from B to C), the effect of deposition inhibition may be strengthened.

On the other hand, in order to fill the gap without occurring voids inside the gap, the repetition ratio of the first sub-cycle (i.e., the deposition step) to the second sub-cycle (i.e., the deposition inhibiting step), the flow rate of deposition inhibitor, and the RF power, etc. may be controlled individually or in combination.

Hereinafter, according to another embodiment of the present invention, a process for controlling the vertical position (i.e., depth) and size of voids formed inside the gap structure by controlling the shape of the deposited film formed on the sidewall of the gap in the gap structure will be described.

FIGS. 14A to 14F are cross-sectional views sequentially illustrating a gap-fill process for controlling a position of a void formed in a gap according to another example embodiments of the present disclosure. A duplicate description of the same or similar content as in the gap-fill process of FIG. 2 will be omitted.

Figures 14A, 14B, 14C, 14D, 14E, 14F:
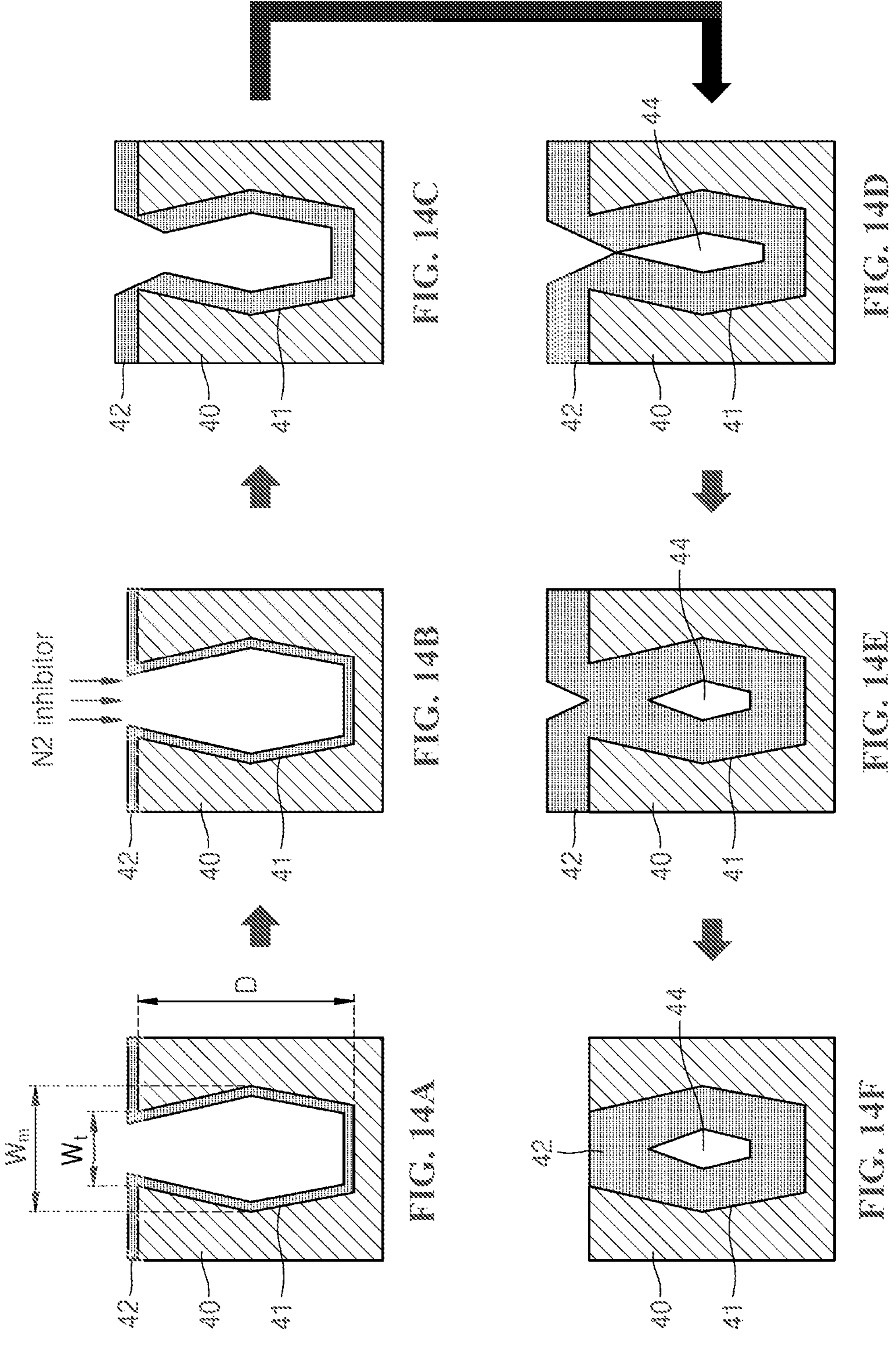
FIGS. 14A-14F are cross-sectional views showing a gap-fill process according to another example embodiments of the present disclosure.

Referring to FIG. 14A, a non-vertical gap structure including a gap 41 in which the width of the gap 41 is larger in a middle region than in an upper region and a lower region along the vertical direction in a part of surface of a substrate 40 is shown. As shown in FIG. 14A, the vertical cross-sectional shape of the gap 41 has a shape in which the width increases from the width Wt of an inlet region of the gap 41 to the width Wm of the middle region thereof. Referring again to FIG. 14A, a gap-fill layer 42 as a gap-fill material may be formed on the surface of the gap structure including the gap 41, in the deposition step of the gap-fill process of the present disclosure. The gap-fill layer 42 may be formed on an exposed surface of the gap structure with a desired thickness by an atomic layer deposition method.

Referring to FIG. 14B, a deposition inhibitor may be supplied to the substrate 40 on which the gap structure is formed, as a deposition inhibiting step. As the deposition inhibitor, at least one or a mixture of nitrogen-containing gases, such as $N_2$, $NH_3$, $N_2+H_2$, may be used. In addition, as the deposition inhibitor, at least one or a mixture of fluorine-containing gases, such as $NF_3$, $F_2$, $CF_4$, $BrF_3$, $SF_6$, and $ClF_3$ may be used.

Referring to FIG. 14C, as a deposition step of the gap-fill layer 42 of FIG. 14A (also referred to as a first sub-cycle) and a deposition inhibiting step of supplying the deposition inhibitor of FIG. 14B (also referred to as a second sub-cycle) are repeatedly performed, that is, as a super-cycle including the first sub-cycle and the second sub-cycle is repeatedly performed, the thickness of the gap-fill layer 42 filling the inside of the gap 41 may gradually increase. In the first sub-cycle, as shown in FIG. 14C, the thickness of the gap-fill layer 42 may be formed relatively constant in the lower region of the gap 41, but in the upper region of the gap 41, the formation of gap-fill layer 42 may be inhibited so that the deposited gap-fill layer 42 has the approximately V-shape.

Referring to FIG. 14D, the gap-fill layer 42 may maintain the V-shaped profile in the inlet region of the gap 41, but the width Wt in the upper region is less than the width Wm of the middle region of the gap 41, so that the inlet region of the gap 41 may be first closed in the gap-fill process and thus, the void 44 may remain inside the gap structure.

Referring to FIG. 14E, as the gap-fill process continues, that is, the deposition step and the deposition inhibitor step repeats, the gap-fill layer 42 may be thickly formed on the void 44.

Subsequently, referring to FIG. 14F, the gap-fill layer 42 that remains around the gap 41 may be removed through an etch back process etc., for surface planarization while maintaining the void 44 within the gap structure, thereby completing the gap-fill process.

FIG. 15 is a conceptual diagram comparing the vertical position (e.g. depth) of the void in the non-vertical gap structure in the gap-fill process according to another example embodiments of the present disclosure.

Figures 15A, 15B, 15C, 15D:
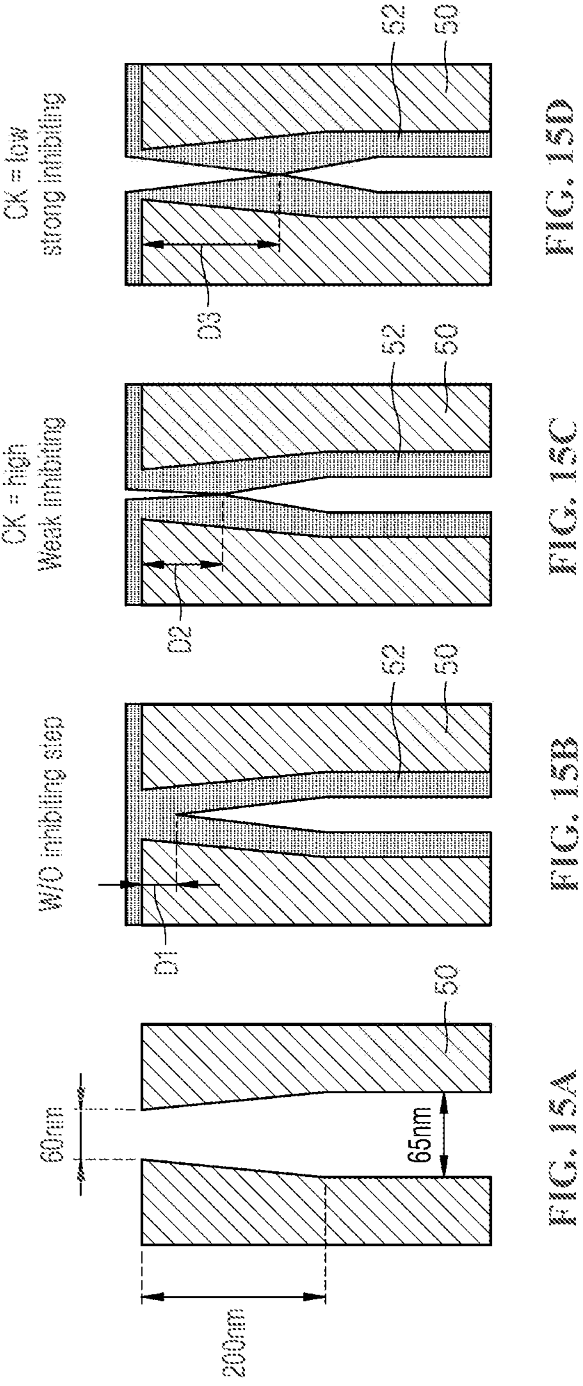
FIGS. 15A-15D is a conceptual diagram comparing the vertical position of a void in a gap structure in a gap-fill process according to another example embodiments of the present disclosure.

FIG. 15A shows a cross-sectional view of a non-vertical gap structure in which the width (65 nm) of the gap in the middle region is large compared to the width (60 nm) in the upper region of the gap in the gap structure of the substrate 50, FIG. 15B shows a cross-sectional view after performing the gap-fill process by forming a film 52 on the sidewall of the gap without performing the deposition inhibiting step, FIG. 15C shows a cross-sectional view when the repetition ratio CK value of the deposition step and the deposition inhibiting step is relatively high, and FIG. 15D shows a cross-sectional view when the CK value is relatively low.

Comparing each case in FIG. 15, when there is no deposition inhibiting step, the depth of the void at which a top of the void is located is 'D1', and when the CK value is high, the depth of the void is 'D2', which is formed more deeply than 'D1'. When the CK value is relatively low, the depth of the void is 'D3', which is formed more deeply than 'D1' and 'D2'. Accordingly, the vertical position of the void may be controlled by controlling the width and depth of the deposition inhibiting region by adjusting the repetition ratio of the deposition step and the deposition inhibiting step. Additionally, after step of FIG. 15D, the deposition step (i.e., a fill step) may be further performed on an open residual portion that is not yet filled on the upper portion of the gap, thereby completely filling the open residual portion of the gap.

Although this embodiment relates to a non-vertical gap structure, in the case of a more complex gap structure, for example, in the case of a gap structure having a three-dimensional internal structure including a protrusion inside the gap, such as a stacked gap structure of a semiconductor device such as 3D NAND, voids may be inside the gap structure. Even in this case, according to the present disclosure, the vertical position (or depth) of the voids may be formed at a desired position, for example, at a deeper position, and thus the voids are prevented from being exposed to the outside in a subsequent process, so that the characteristics of the semiconductor device may be reliably maintained.

FIG. 16 is a diagram comparing the vertical position (depth) and size of a void in a gap according to the magnitude of repetition ratio of first sub-cycle to second sub-cycle according to another example embodiments of the present disclosure.

Figures 16A, 16B, 16C:
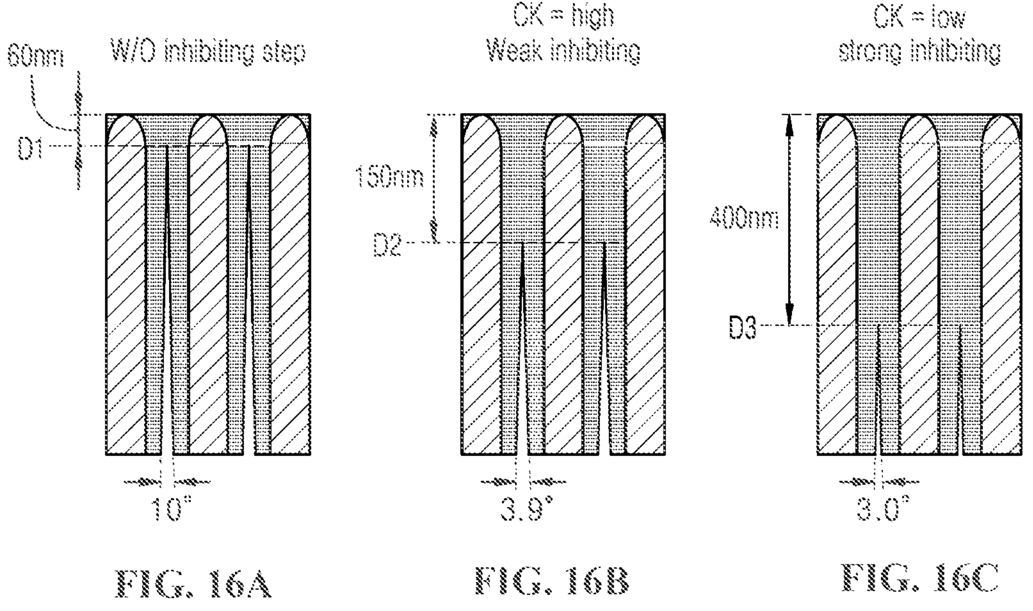
FIGS. 16A-16C is a diagram comparing the vertical position and size of a void in a gap structure according to the magnitude of a repetition ratio of the number of the first sub-cycle to the number of the second sub-cycle according to another example embodiments of the present disclosure.

FIG. 16 are cross-sectional views comparing the vertical positions (depths) of voids according to the application of the present invention in a vertical gap structure. FIG. 16A shows a case in which a gap is filled with an $SiO_2$ film by an atomic layer deposition method without the deposition inhibiting step, FIG. 16B shows a case in which CK=30 (that is, the deposition step is repeated 30 times per one time of the deposition inhibiting step) is applied, and FIG. 16C shows a case in which CK=16 (that is, the deposition step is repeated 16 times per one time of the deposition inhibiting step) is applied.

The deposition step was conducted while alternately supplying a Si source gas and an oxygen reaction gas activated by the plasma, and the deposition inhibiting step was conducted while supplying the nitrogen trifluoride ($NF_3$) activated by the plasma. In the case of FIG. 16A without the deposition inhibiting step, the depth of the void is about 60 nm, and the angle of the two sides of the void is about 10 degrees. In the case of FIG. 16B to which CK=30 is applied, the depth of the void is about 150 nm, and the angle of the two sides of the void is about 3.9 degrees. In the case of FIG. 16C to which CK=16 is applied, the depth of the void is about 400 nm, and the angle of the two sides of the void is about 3.0 degrees. Therefore, by adjusting the CK value, the depth and size of the void in the gap may be controlled.

On the other hand, in the step of repeating the super-cycle, the repetition ratio of the number of first sub-cycles to the number of second sub-cycles is kept constant, but in other embodiments, the step of repeating the super-cycle may be performed while gradually increasing or gradually decreasing the repetition ratio of the number of first sub-cycle to the number of second sub-cycle.

Further, in the case of this embodiment, it has been described that by adjusting the repetition ratio of the first sub-cycle (the deposition step) number to the second sub-cycle (the deposition inhibiting step) number in the gap-fill process, the position (depth) and size of the void in the gap may be controlled. However, as described above, the position (depth) and size of the void in the gap may be controlled by adjusting the flow rate of the deposition inhibitor, the magnitude of the RF power provided in the deposition inhibiting step, and the like. The position (depth) and size of the void in the gap may be controlled by adjusting the repetition rate of the first sub-cycle (deposition step) to the second sub-cycle (deposition inhibiting step), the flow rate of the deposition inhibitor, the magnitude of the RF power, and the like independently, respectively, or in combination thereof.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A method of processing a substrate, the method comprising:

providing the substrate into a reaction space, the substrate comprising a gap having a predetermined cross-sectional area and a depth;

performing a first sub-cycle step for depositing a gap filling material by a predetermined thickness along a surface of the gap by an atomic layer deposition method;

performing a second sub-cycle step for forming a deposition inhibiting region in an upper region of the gap using a deposition inhibitor; and repeating a super-cycle such that a cross-sectional area of an inlet region of the gap remains greater than a cross-sectional area of a lower region thereof located below the inlet region, the super-cycle comprising at least one the first sub-cycle and at least one the second sub-cycle, wherein the gap is filled without an occurrence of a void in the gap, and wherein a reactant is continuously supplied during the first sub-cycle step.

2. The method of processing a substrate of claim 1, wherein, in the step of repeating the super-cycle, a repetition ratio of the number of the first sub-cycle to the number of the second sub-cycle is adjusted to control a depth of a deposition inhibiting end point of the deposition inhibiting region.

3. The method of processing a substrate of claim 2, wherein the repetition ratio of the number of the first sub-cycle to the number of the second sub-cycles is in a range of about 15 to about 40.

4. The method of processing a substrate of claim 2, wherein the step of repeating the super-cycle is performed while constantly maintaining the repetition ratio of the number of the first sub-cycle to the number of the second sub-cycle.

5. The method of processing a substrate of claim 2, wherein the step of repeating the super-cycle is performed while gradually increasing or decreasing the repetition ratio of the number of the first sub-cycle to the number of the second sub-cycle.

6. The method of processing a substrate of claim 1, wherein, in the step of repeating the super-cycle, a flow rate of the deposition inhibitor in the second sub-cycle is adjusted to control a depth of a deposition inhibiting end point of the deposition inhibiting region.

7. The method of processing a substrate of claim 1, further comprising repeating only the first sub-cycle after the step of repeating the super-cycle is completed.

8. The method of processing a substrate of claim 1, wherein a purge gas is continuously supplied during the first sub-cycle step.

9. The method of processing a substrate of claim 1, wherein the super-cycle further comprises performing a gas exchange step in at least one of between the first sub-cycle and the second sub-cycle and between the second sub-cycle and the first sub-cycle.

10. The method of processing a substrate of claim 9, wherein the gas exchange step comprises a vacuum purge step and at least one of a reaction gas pre-flow step and a deposition inhibitor pre-flow step.

11. The method of processing a substrate of claim 1, wherein the deposition inhibitor comprises at least one of a nitrogen-containing gas or a fluorine-containing gas.

12. The method of processing a substrate of claim 11, wherein the fluorine-containing gas comprises at least one of $F_2$, $CF_4$, $BrF_3$, $SF_6$ and $ClF_3$, or mixtures thereof.

13. The method of processing a substrate of claim 1, wherein, in the second sub-cycle, a high frequency power and a low frequency power are supplied at the same time to activate the deposition inhibitor.

14. The method of processing a substrate of claim 1, wherein the gap is a non-vertical gap in which a width of the gap in a middle region of the gap is greater than the width thereof in an upper region of the gap.

15. The method of processing a substrate of claim 1, wherein performing the first sub-cycle step comprises providing a first RF power of a first intensity and performing the second sub-cycle step comprises providing a second RF power of a second intensity, wherein the second intensity is less than the first intensity.

* * * * *